US008283655B2

(12) United States Patent
Chabinyc et al.

(10) Patent No.: US 8,283,655 B2
(45) Date of Patent: Oct. 9, 2012

(54) PRODUCING LAYERED STRUCTURES WITH SEMICONDUCTIVE REGIONS OR SUBREGIONS

(75) Inventors: Michael L. Chabinyc, San Francisco, CA (US); Tse Nga Ng, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 808 days.

(21) Appl. No.: 11/960,874

(22) Filed: Dec. 20, 2007

(65) Prior Publication Data
US 2009/0159875 A1    Jun. 25, 2009

(51) Int. Cl.
H01L 51/00    (2006.01)
(52) U.S. Cl. .............. 257/40; 257/E51.012; 438/69
(58) Field of Classification Search .............. None
See application file for complete search history.

(56) References Cited

U.S. PATENT DOCUMENTS

| | | | |
|---|---|---|---|
| 5,454,880 A | 10/1995 | Sariciftci et al. | |
| 5,504,323 A | 4/1996 | Heeger et al. | |
| 5,517,031 A * | 5/1996 | Wei et al. | 250/370.08 |
| 6,197,663 B1 | 3/2001 | Chandross et al. | |
| 6,297,495 B1 | 10/2001 | Bulovic et al. | |
| 6,300,612 B1 * | 10/2001 | Yu | 250/208.1 |
| 6,804,149 B2 | 10/2004 | Ogura et al. | |
| 6,806,473 B2 * | 10/2004 | Honda et al. | 250/370.11 |
| 6,921,679 B2 | 7/2005 | Chabinyc et al. | |
| 7,033,516 B2 | 4/2006 | Wong et al. | |
| 7,056,632 B2 | 6/2006 | Ioannidis | |
| 7,091,660 B2 | 8/2006 | Park et al. | |
| 7,271,535 B2 | 9/2007 | Kobayashi | |
| 7,279,777 B2 | 10/2007 | Bai et al. | |
| 7,291,969 B2 | 11/2007 | Tsutsui | |
| 7,586,080 B2 | 9/2009 | Chabinyc et al. | |
| 7,755,156 B2 * | 7/2010 | Chabinyc et al. | 257/443 |
| 2002/0109097 A1 * | 8/2002 | Tashiro | 250/370.09 |
| 2002/0155729 A1 | 10/2002 | Baldwin et al. | |
| 2003/0127967 A1 | 7/2003 | Tsutsui et al. | |
| 2003/0137061 A1 | 7/2003 | Bailey et al. | |
| 2004/0027061 A1 | 2/2004 | Seo et al. | |

(Continued)

OTHER PUBLICATIONS

McCulloch, I., Heeney, M., Bailey, C., Genevicius, K., MacDonald, I., Shkunov, M., Sparrowe, D., Tierney, S., Wagner, R., Zhang, W., Chabinyc, M.L., Kline, R.J., McGehee, M.D., and Toney, M.F., "Liquid-crystalline semiconducting polymers with high charge-carrier mobility", nature materials, vol. 5, Apr. 2006, pp. 328-333.

(Continued)

Primary Examiner — Benjamin Sandvik
(74) Attorney, Agent, or Firm — Marger Johnson & McCollom, P.C.

(57) ABSTRACT

In layered structures, channel regions and light-interactive regions can include the same semiconductive polymer material, such as with an organic polymer. A light-interactive region can be in charge-flow contact with a contacting electrode region, and a channel region can, when conductive, provide an electrical connection between the contacting electrode region and other circuitry. For example, free charge carriers can be generated in the light-interactive region, resulting in a capacitively stored signal level; the signal level can be read out to other circuitry by turning on a transistor that includes the channel region. In an array of photosensing cells with organic thin film transistors, an opaque insulating material can be patterned to cover a data line and channel regions of cells along the line, but not extend entirely over the cells' light-interactive regions.

28 Claims, 9 Drawing Sheets

U.S. PATENT DOCUMENTS

| | | | |
|---|---|---|---|
| 2004/0041097 A1* | 3/2004 | Ishii et al. | 250/370.07 |
| 2005/0133788 A1 | 6/2005 | Chabinyc et al. | |
| 2006/0147749 A1 | 7/2006 | Meng et al. | |
| 2007/0023746 A1 | 2/2007 | Birau et al. | |
| 2007/0158644 A1* | 7/2007 | Chabinyc et al. | 257/40 |
| 2009/0108304 A1 | 4/2009 | Ng et al. | |
| 2009/0152534 A1 | 6/2009 | Chabinyc et al. | |
| 2009/0159781 A1 | 6/2009 | Chabinyc et al. | |
| 2009/0243020 A1 | 10/2009 | Chabinyc et al. | |

OTHER PUBLICATIONS

Chabinyc, M., "Controlling the performance of semiconducting polymers for printed electronics", 2007 MRS Spring Meeting, Apr. 9-13, 2007, San Francisco, California, Abstract, 1 page.

McCulloch, I., Bailey, C., Heeney, M., Shkunov, M., Sparrowe, D., Tierney, S., Chabinyc, M., Kline, J., The development of pBTTT, 2007 MRS Spring Meeting, Apr. 9-13, 2007, San Francisco, California, Abstract, 1 page.

Notice of Allowance and Fee(s) Due in U.S. Appl. No. 11/959,901, mailed May 13, 2009, 12 pages.

Yu, G., Wang, J., McElvain, J., and Heeger, A.J., "Large-Area, Full-Color Image Sensors Made with Semiconducting Polymers," Wiley-VCH Verlag GmbH, Adv. Mater., vol. 10, No. 17, 1998, pp. 1431-1434.

Sirringhaus, H., Tessler, N., Friend, R.H., "Integrated Optoelectronic Devices Based on Conjugated Polymers," Science, vol. 280, Jun. 12, 1998, pp. 1741-1744.

Granstrom, M., Petritsch, K., Arias, A.C., Lux, A., Andersson, M.R., & Friend, R.H., "Laminated fabrication of polymeric photovoltaic diodes," Nature, vol. 395, Sep. 17, 1998, pp. 257-260.

Yu, G., Srdanov, G., Wang, J., Wang, H., Cao, Y., and Heeger, A.J., "Large area, full-color, digital image sensors made with semiconducting polymers," Synthetic Metals 111-112, 2000, pp. 133-137.

Rogers., J.A., Bao, Z., Baldwin, K., Dodabalapur, A., Crone, B., Raju. V.R., Kuck, V., Katz, H., Amundson, K., Ewing, J., and Drzaic, P., "Paper-like electronic displays: Large-area rubber-stamped plastic sheets of electronics and microencapsulated electrophoretic inks," PNAS, vol. 98, No. 9, Apr. 24, 2001, pp. 4835-4840.

Arias. A.C., "Vertically Segregated Polymer Blends: Their Use in Organic Electronics," Journal of Macromolecular Science, Part C: Polymer Reviews, vol. 46, 2006, pp. 103-125.

Loo, Y.-L., Someya, T., Baldwin, K.W., Bao, Z., Ho, P., Dodabalapur, A., Katz, H.E., and Rogers., J.A., "Soft, conformable electrical contacts for organic semiconductors: High-resolution plastic circuits by lamination," PNAS, vol. 99, No. 16, Aug. 6, 2002, pp. 10252-10256.

Street, R.A., Graham, J., Popovic, Z.D., Hor, A., Ready, S., Ho, J., "Image sensors combining an organic photoconductor with a-Si:H matrix addressing," Journal of Non-Crystalline Solids 299-302, 2002, pp. 1240-1244.

Chabinyc, M.L., Salleo, A., Wu, Y., Liu, P., Ong, B.S., Heeney, M., and McCulloch, I., "Lamination Method for Study of Interfaces in Polymeric Thin Film Transistors," J. Am. Chem. Soc., vol. 126, 2004, pp. 13928-13929.

Someya, T., Kato, Y., Iba, S., Noguchi, Y., Sekitani, T., Kawaguchi, H., and Sakurai, T., "Integration of Organic FETs With Organic Photodiodes for a Large Area, Flexible, and Lightweight Sheet Image Scanners," IEEE Transactions on Electron Devices, vol. 52, No. 11, Nov. 2005, pp. 2502-2511.

Huang, A., "Fabrication and Test Characterization of Organic Poly (3,3'" dialkylquarterthiophene) (PQT-12) Transistors," 24th Annual Microelectronic Engineering Conference, May 2006, pp. 20-24.

Wong, W.S., Ready, S.E., Matusiak, R., White, S.D., Lu, J.-P., Ho, J.H., and Street, R.A., "Amorphous silicon thin-film transistors and arrays fabricated by jet printing," Applied Physics Letters, vol. 80, No. 4, Jan. 28, 2002, pp. 610-612.

Wong, W.S., Ng, T.N., Chabinyc, M.L., Lujan, R.A., Apte, R.B., Sambadan, S., Limb, S., and Street, R.A., Flexible a-Si:H-based Image Sensors Fabricated by Digital Lithography, 2007 Materials Research Society, Spring Meeting, Apr. 9-13, 2007, San Francisco, 5 pages.

Ng, T.N., Wong, W.S., Lujan, R.A., Apte, R.B., Chabinyc, M.L. Sambadan, S., Ready, S., Limb, S., and Street, R.A., "Flexible light sensor arrays fabricated by digital lithography," slides presented at Materials Research Society, Spring Meeting, Apr. 9-13, 2007, San Francisco, 14 pages.

Ng, T.N., Lujan, R.A., Sambadan, S., Street, R.A., Limb, S., and Wong, W.S., "Low temperature a-Si:H photodiodes and flexible image sensor arrays patterned by digital lithography," Applied Physics Letters, vol. 91, 2007, pp. 063505-1 through 063505-3.

Office communication in U.S. Appl. No. 11/959,187, mailed Oct. 15, 2009, 13 pages.

Amendment Submitting Terminal Disclaimer in U.S. Appl. No. 11/959,187, submitted Nov. 4, 2009, 20 pages.

Office communication in U.S. Appl. No. 11/924,678, mailed Jul. 8, 2010, 6 pages.

Office communication in U.S. Appl. No. 12/482,610, mailed Apr. 23, 2010, 15 pages.

Office communication in U.S. Appl. No. 11/959,187, mailed Mar. 5, 2010, 9 pages.

Office communication in U.S. Appl. No. 11/959,187, mailed Apr. 1, 2010, 6 pages.

* cited by examiner

US 8,283,655 B2

PRODUCING LAYERED STRUCTURES WITH SEMICONDUCTIVE REGIONS OR SUBREGIONS

This application is related to co-pending U.S. patent application Ser. No. 11/959,187, entitled "Producing Layered Structures with Lamination", and Ser. No. 11/959,901, entitled "Producing Layered Structures with Layers that Transport Charge Carriers", both of which are incorporated herein by reference in their entireties.

BACKGROUND OF THE INVENTION

The present invention relates generally to production of layered structures with semiconductive regions or subregions. For example, a layered structure can include channel regions or subregions and light-interactive regions or subregions, such as in cells of photosensing arrays.

A multitude of layered structures with semiconductive layers have been proposed for many different uses. For example, several techniques have been proposed for photosensing applications.

Someya, T., Kato, Y., Iba, S., Noguchi, Y., Sekitani, T., Kawaguchi, H., and Sakurai, T., "Integration of Organic FETs With Organic Photodiodes for a Large Area, Flexible, and Lightweight Sheet Image Scanners", *IEEE Transactions on Electron Devices*, Vol. 52, No. 11, November 2005, pp. 2502-2511 describe a manufacturing process for image scanners in which an organic FET matrix and a photodiode matrix are manufactured separately on different plastic films and then laminated with each other using a silver paste patterned by a microdispenser or using anisotropic conductive films. In producing the FET matrix, a 50-nm-thick pentacene is deposited to form a channel layer after purifying the pentacene. The photodiode matrix includes a layer of p-type semiconductor of copper phthalocyanine and a layer of n-type semiconductor of 3,4,9,10-perylene-tetracarboxylic-diimide (PTCDI).

Sirringhaus, H., Tessler, N., and Friend, R. H., "Integrated Optoelectronic Devices Based on Conjugated Polymers", *Science*, Vol. 280, 12 Jun. 1998, pp. 1741-1744, describe an all-polymer semiconductor integrated device with a conjugated polymer field-effect transistor (FET) driving a polymer light-emitting diode (LED) of similar size. The FET uses regioregular poly(hexylthiophene) (P3HT) and the LED area included a spin-coated layer of poly[2-methoxy-5-(2'-ethylhexyloxy)-p-phenylene-vinylene](MEH-PPV) on an Au drain electrode of the FET.

It would be advantageous to have improved techniques for layered structures that include semiconductive regions.

SUMMARY OF THE INVENTION

The invention provides various exemplary embodiments, including structures, devices, arrays, and methods. In general, the embodiments are implemented with layered structures in which semiconductive regions include the same semiconductive polymer material.

These and other features and advantages of exemplary embodiments of the invention are described below with reference to the accompanying drawings.

DETAILED DESCRIPTION

Figure 1:
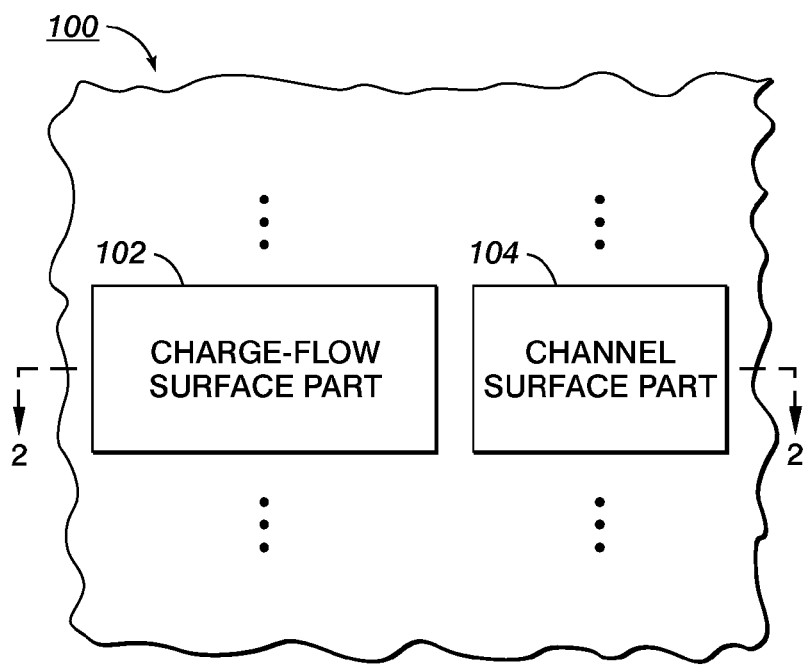
FIG. 1 is a schematic top view of a fragment of a layered structure in which a substructure has charge-flow surface parts and channel surface parts.

In the following detailed description, numeric values and ranges are provided for various aspects of the implementations described. These values and ranges are to be treated as examples only, and are not intended to limit the scope of the claims. In addition, a number of materials are identified as suitable for various facets of the implementations. These materials are to be treated as exemplary, and are not intended to limit the scope of the claims. In the description and the claims, the words "a" or "an" include any number greater than or equal to one.

Many electronic parts, components, and devices can be implemented with layered structures, i.e. structures that include layers. Such structures typically include layers or parts of layers that are electrically conductive and other layers or parts of layers that are electrically insulating. Still other layers or parts of layers are "semiconductive", meaning that they can be either electrically insulating or electrically conductive, depending on one or more conditions or stimuli that can change without departing from applicable normal operating conditions. Electrically conductive, electrically insulating (e.g. dielectric), and semiconductive layers or parts of layers can each be implemented with a wide variety of materials in a wide variety of geometries; regardless of the materials and geometry, a part of a layer that has a certain characteristic and that extends in three dimensions is sometimes referred to herein as a "region", a "subregion", or a "portion" of a layer, region, or subregion.

The exemplary implementations described below address problems that arise with layered structures that include electrically conductive and/or semiconductive material. Some problems are specific to layered structures in which interactions with light can occur.

More generally, problems arise due to complexity of layered structures. For example, each additional operation in fabricating a layered structure introduces an additional risk of impaired performance or failure. An additional operation can be needed, for example, due to an additional material or to provide to an additional process that affects the same material differently in one location than in other locations. The additional operation might, for example, damage a previously deposited material, or it might be a source of unreliability, sometimes producing a defect that prevents the structure from operating predictably or from operating as required for a given application.

In specific examples, problems arise in fabricating large area image sensors with inorganic photosensor layers; such photosensor layers must be on the order of 1 micron (μm) in thickness for maximum sensitivity, making it difficult to integrate them on mechanically flexible substrates. Furthermore, conventional inorganic photosensor semiconductor materials such as amorphous silicon (a-Si) require relatively long deposition times and are likely to fail mechanically, such as by cracking. Organic photosensor materials such as certain organic polymers, on the other hand, have been shown to have good sensitivity and performance in single element devices and solar cells, but are difficult to integrate into large area arrays with many discrete cells and the other necessary circuitry, as are typically used in light-interactive applications such as image sensing.

The exemplary implementations described below include various features that address these and related problems.

In general, the implementations involve structures, articles, or parts or components of structures or articles that are connected in some way. For example, structures, articles, or parts or components of structures or articles may sometimes be referred to as "attached" to each other or to other structures, articles, parts, or components or vice versa, and operations are performed that "attach" structures, articles, or parts or components of structures or articles to each other or to other things or visa versa; the terms "attached", "attach", and related terms refer to any type of connecting that could be performed in the context. One type of attaching is "mounting", which occurs when a first part or component is attached to a second part or component that functions as a support for the first. In contrast, the more generic term "connecting" includes not only "attaching" and "mounting", but also integrally forming a structure or a structure's components or parts and making other types of connections such as electrical connections between or among devices or components of circuitry. A combination of one or more parts connected in any way is sometimes referred to herein as a "structure"; a structure may include one or more structures within it, sometimes referred to herein as "substructures".

Two or more parts or components of a structure are "electrically connected" when electrical current meeting an appropriate criterion can flow between them under conditions that normally apply during use or operation of the structure. An appropriate criterion would, for example, distinguish between electrical current that can carry signals on the one hand and electrical current that can carry only noise; "parasitic" or "leakage" current is one type of noise-only current that can occur in many structures due, for example, to defects, design limitations, or fundamental physical limits. Parts or components can be electrically connected in many ways, including, for example, through direct electrical connection or through other parts or components that are electrically conductive.

An "electronic component" or simply "component" is a part within which, in operation, movement of charge carriers occurs, such as movement of electrons or holes. Unless the context indicates otherwise, the terms "circuitry" and "circuit" are used herein to refer to structures in which one or more electronic components have sufficient electrical connections to operate together or in a related manner. In some instances, an item of circuitry can include more than one circuit.

A "lead" is a part of a component at which the component is electrically connected to one or more other components, while a "line" is a simple electrically conductive component, typically extending between and electrically connecting two or more leads or other electrical connection points; a line could, for example, carry electrical signals, such as a data line in an array. A "channel" is a part of a component through which electrical current can flow by movement of charge carriers. A channel typically extends between two ends, sometimes referred to as "channel ends", and leads through which channel ends are electrically connected to other components are sometimes referred to herein as "channel leads". A channel is "conductive" when it is in a state in which current can flow through it.

A "transistor" is a component that has a channel that extends between two channel leads, and that also has a third lead—referred to as a "gate lead" or simply "gate"—such that the channel can be switched or otherwise controlled between high and low impedance by electrical signals that change potential difference between the gate and one of the channel leads. If a transistor is structured or connected so that the channel's conductivity is always controlled by the potential difference between the gate and the same one of the channel leads, that channel lead is referred to as the "source", while the other channel lead is referred to as the "drain". Other components may have leads called gates, sources, drains, and so forth by analogy to transistors.

Some of the components described herein employ structures with one or more dimensions smaller than 1 mm, and various techniques have been proposed for producing such structures. In particular, some techniques for producing such structures are referred to as "microfabrication." Examples of microfabrication include various techniques for depositing materials such as growth of epitaxial material, sputter deposition, evaporation techniques, plating techniques, spin coating, printing, and other such techniques; techniques for patterning materials, such as etching or otherwise removing exposed regions of thin films through a photolithographically patterned resist layer or other patterned layer; techniques for polishing, planarizing, or otherwise modifying exposed surfaces of materials; and so forth.

In general, some of the structures, elements, and components described herein are supported on a "support structure" or "support surface", which terms are used herein to mean a structure or a structure's surface that can support other structures. More specifically, a support structure could be a "substrate", used herein to mean a support structure on a surface of which other structures can be formed or attached by microfabrication or similar process.

As used herein, a "layer" is a thickness of material, whether or not patterned in any way. A layer "includes" a specified type of material if material of the specified type is present in any part of the layer; a layer is "of" a specified type of material if material of the specified type is predominant throughout the layer. A layer may be homogeneous or its composition or characteristics may vary. A layer may include two or more layers or parts of layers within it, sometimes referred to as "sublayers".

As mentioned above, a "layered structure" refers herein to a structure that includes layers, such as microfabricated or thin film layers. A layered structure can be on a substrate or other support structure; a substrate can itself be one of the layers in a layered structure, and the substrate may in turn include layers within its structure. More generally, a layer can be or include a layered structure.

An "integrated structure", "integrated circuit", or "IC" is a structure with electronic components and connections produced by microfabrication or similar processes. Implementations of ICs described herein include features characterized as "cells" (or "elements") and "arrays", terms that are used with related meanings: An "array" is an arrangement of "cells" or "elements"; unless otherwise indicated by the context, the words "cell" and "element" are used interchangeably herein to mean a cell or an element of an array. In a layered structure that is an array, each cell's portion of the layered structure is sometimes referred to herein as a "cell region". An IC that includes an array can also include "peripheral circuitry", meaning circuitry outside the array, in contrast with "external circuitry", meaning circuitry that is not only outside the array but also not on the same IC with the array.

"Light" refers herein to electromagnetic radiation of any wavelength or frequency. The term "sensing" is used herein in the most generic sense of obtaining information from a physical stimulus; sensing therefore includes actions such as detecting, measuring, and so forth. To "photosense" is to sense light. Light that is photosensed or otherwise received by an electronic component is sometimes referred to herein as "incident light". An IC with an array of cells, at least some of which perform photosensing, is sometimes referred to herein as a "photosensing array". A "photoconductive" material, or simply a "photoconductor", is a material that generates free charge carrier, such as free electron-hole pairs, in response to incident light; photoconductive materials can be used in producing various kinds of photosensors.

An "electrode" is a conductive part or component of an electronic device; although the term "electrode" is usually used for a part or component that operates in some way other than solely as a line, an electrode could be part of a line. Various electrodes can, for example, operate as gate, source, and drain of transistor structures, as plates of capacitive components, as contact pads, and so forth. A "channel end electrode" is an electrode serving as a channel lead, such as a source and/or drain of a transistor. As used herein, a "cell electrode" is an electrode within a cell region, typically within an active circuitry layer of the cell region.

Similarly, a layer, region, subregion, or portion may be described by its operation, such as an "active circuitry layer", meaning a layer within which charge carriers move to store or transfer information during operation, such as in operations that accumulate or store charge or provide or receive electrical signals; an active circuitry layer could include channels of one or more transistors, for example. Also, a "top electrode layer" is typically used herein to mean a layer that is not an active circuitry layer but that includes electrodes that can operate as top electrodes for cells of an array; as used herein, a "top electrode" need not be on top of an array or over or above the array, but is typically separated from an array by one or more other layers that are neither electrode layers nor active circuitry layers. More generally, an "electrode region" refers herein to a region, subregion, or other layer part that is part or all of an electrode, while a "gate electrode region" refers more specifically to a region, subregion, or other layer part that can operate as a gate, controlling conductivity of a channel. A "channel region" is a region that can operate as a channel, such as a channel of a transistor.

In addition, a layer or region, subregion, or portion of a layer may be characterized by the material it contains, a description of its conductivity, or another characteristic of its structure: Exemplary terms include "electrically conductive" layer, region, or portion, i.e. a region or portion that is electrically conductive; "semiconductive" region or portion, meaning a region or portion that is semiconductive; an "electrically insulating layer portion", meaning a portion of an electrically insulating layer; and an "open region" meaning a region defined in a layer or portion of a layer in which the layer's material is not present.

Top electrodes in arrays provide a directional orientation as follows: A direction away from a top electrode toward an active circuitry layer is "down", "under", or "below", while a direction from an active circuitry layer toward a top electrode is "up", "over", or "above". The terms "upper" and "top" are typically applied to structures, components, or surfaces disposed toward, at, or above a top electrode, while "lower" or "underlying" are applied to structures, components, or surfaces disposed toward, at, or below an active circuitry layer. In general, it should be understood that the above directional orientation is arbitrary and only for ease of description, and that an array may have any appropriate orientation. Also, a similar orientation could be applied by analogy to a structure that does not include a top electrode or to an incomplete structure to which a top electrode has not yet been attached.

A structure or component is "directly on" or sometimes simply "on" a surface when it is both over and in contact with the surface; more generally, two surfaces "meet each other" or simply "meet" when they are in contact in the same way they would be if one were directly on the other. Similarly, a layer, region, subregion, or portion "covers" another part or component if the layer, region, subregion, or portion is on substantially all of an upper surface of the part or component; a surface or surface part that is not covered in a given context may be referred to as "exposed". Also, the term "covering layers" refers to one or more layers or layer parts that are on or over another part, and may be referred to as that part's covering layers; covering layers may include, for example, an "opaque layer", meaning a layer that, under normal conditions occurring during use or operation, sufficiently absorbs or otherwise prevents transmission of light through it so that the remaining amount of transmitted light does not prevent use or operation of the layered structure.

A structure is "fabricated on" a surface when the structure was produced on or over the surface by microfabrication or similar processes. A process that produces a layer or other accumulation of material over or directly on a surface, such as a substrate's surface, can be said to "deposit" the material.

Where an upper layer, region, subregion, or portion is generally above a lower part or component but not over it, the upper layer, region, subregion or portion may be referred to as "not extending over" the lower part or component. When the upper layer, region, subregion, or portion "does not extend entirely over" the lower part or component, the upper layer, region, subregion, or portion could be over part of the lower part or component, but not over all of it.

A surface is "on" a layer or layer part such as a region or subregion, or the layer or layer part "has" a surface, if the surface is an exterior surface of the layer or layer part such as an exposed surface or a surface at which it meets another layer or layer part. Similarly, a surface is "on" a layered structure or substructure, or the structure or substructure "has" a surface, if the surface is an exterior surface of the layered structure or substructure such as an exposed surface or a surface at which it meets another structure or substructure. Conversely, a layer is deposited or otherwise produced "on" a structure or substructure if, after its production, the layer is on a surface that was previously an external surface of the structure or substructure; after production, such a layer may be described herein as included in the structure or substructure on which it was produced.

Like a layer, a surface or surface part may be described by its operation, such as a "carrier-active surface part", meaning a part of a surface through or at which interaction with charge carriers occurs in operation, such as flow of charge carriers through the surface or generation or recombination of charge carriers at the surface; an "charge-flow surface part", meaning a carrier-active surface part through which charge carriers flow during operation, such as to or from another surface that meets the charge-flow surface part; a "channel surface part", meaning a part of a surface that is on or bounds a channel region, such as a channel of a transistor structure; and a "line surface part", meaning a part of a surface that is on or bounds an electrically conductive line. In addition, a surface or surface part may be characterized by the material it contains, a description of its conductivity, or another characteristic of its structure; for example, a "patterned surface" is a surface that has parts in a pattern, such as due to microfabrication, printing, or other similar patterning processes.

Some of the exemplary implementations described below include a "laminating" or "lamination" operation, meaning an operation that occurs in producing a layered structure and that attaches two or more previously existing substructures, with each pair of adjacent substructures having surfaces that meet each other; after a laminating or lamination operation, the substructures are referred to as "laminated". In a typical implementation, each laminated substructure is also a layered structure produced, for example, by microfabrication, lamination, or similar operations.

Figure 2:
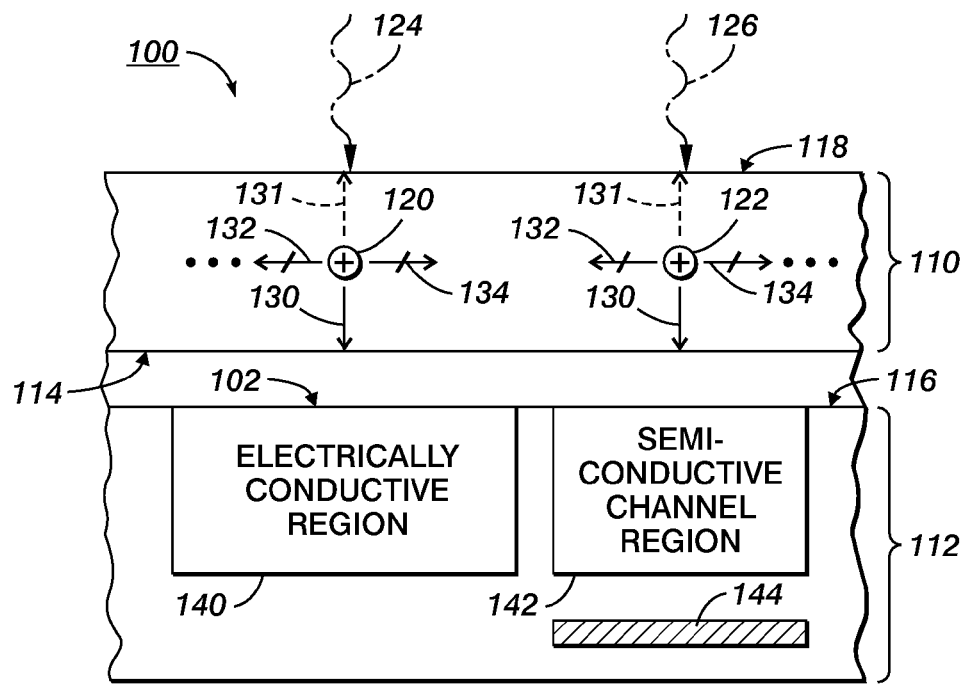
FIG. 2 is a schematic cross section of a fragment as in FIG. 1, taken along the line 2-2 in FIG. 1.

FIGS. 1 and 2 show an example of a layered structure that includes a substructure with two different types of surface parts on two different types of regions. Structure fragment 100 includes one or more charge-flow surface parts, with surface part 102 being a representative example, as suggested by the ellipses above and below it. Similarly, structure fragment 100 includes one or more channel surface parts, with surface part 104 being a representative example, as suggested by the ellipses above and below it.

The cross-section of fragment 100 in FIG. 2 shows two substructures, carrier-transporting substructure 110 and circuitry substructure 112, with respective surfaces 114 and 116 disposed toward each other and with substructure 110 also having surface 118 disposed away from substructure 112; where surfaces are disposed toward each other, as surfaces 114 and 116 are in FIG. 2, one or both of them may be referred to as a "facing surface". Although surfaces 114 and 116 are shown slightly separated for illustratively purposes, they could meet, as in some exemplary implementations described below; also, rather than being approximately flat as shown, surfaces 114 and 116 could each depart from flatness, as in some of the exemplary implementations. Even if they depart from flatness, however, each of surfaces 114 and 116 extends "approximately perpendicularly" to a thickness direction of its structure or substructure, meaning that most of its area is closer to being perpendicular to the thickness direction than to being parallel to it, even though such a surface can locally include a relatively small area that is closer to being parallel to the thickness direction, as illustrated in some of the exemplary implementations described below.

In operation, substructure 110 transports charge carriers, illustratively shown by holes 120 and 122; a carrier-transporting substructure could transport other types of charge carriers such as electrons, for example, depending on materials in the substructure. In the illustrated example, holes 120 and 122 are transported to surface 114, which operates as an output surface for substructure 110, but the direction of transport could instead be toward surface 118 which could also operate as an output surface, providing charge carriers to a top electrode or other conductive component (not shown). In general, direction of charge carrier transport depends on orientation of electric field, sign of charge carriers, and properties of material in substructure 110. A net current can flow across substructure 110, such as due to charge injection at the surface opposite an output surface at which charge carriers are provided.

As suggested by rays 124 and 126 incident on substructure 110, holes 120 and 122 are transported to one of surfaces 114 and 118 in response to incident light.

In exemplary implementations described below, substructure 110 includes one or more layers or sublayers of material that are produced by solution processing. As used herein, the term "solution processing" includes any of a variety of processing techniques in which coatings, films, or other layers are produced, not by melt processing or the like, but by using a solution of material in a solvent; solution processing therefore typically includes drying or removal of solvent from a solution. Examples of materials that can be used in solution processing include polymer material or blends of polymers and small molecules or other polymers (e.g. a tetraphenylene-diamine in polycarbonate); examples of polymers that can be used in solution processing include "organic polymer", referring herein to any material that includes polymerized organic compounds, such as poly(3-hexylthiophene) or poly[(2-alkoxy,5-alkoxy)-1,4-phenylene vinylene]; other examples of materials that can be used in solution processing include inorganic materials such as amorphous silicon or colloidal particles such as nanoparticles of PbS or PbSe, i.e. particles with diameter not greater than approximately 100 nm. As used herein, the more general terms "polymer" and "polymer material" include not only any organic polymer as defined above but also any "inorganic polymer", i.e. a material that contains a backbone of polymerized inorganic compounds, e.g. a polysilane, whether or not it can be used in solution processing.

In operation, substructure 110 transports charge carriers such as holes anisotropically, as illustrated by arrows 130, 131, 132, and 134 in FIG. 2; as used herein, charge carriers are transported "anisotropically" if they are transported at different speeds in different directions. For example, arrows 130 indicate that holes 120 and 122 are transported at a relatively high speed toward surface 114, and dashed arrows 131 similarly indicate that holes 120 and 122 could alternatively be transported at a relatively high speed toward surface 118; crossed arrows 132 and 134, on the other hand, indicate that holes 120 and 122 are transported at relatively low speeds or not at all in leftward and rightward directions, respectively, parallel to surfaces 114 and 118. More specifically, transport in directions parallel to surfaces 114 and 118 is "negligible", meaning that if a charge carrier's net resultant transport were analyzed into vectors perpendicular and parallel to surface 114, the parallel vector's magnitude is a small fraction of the perpendicular vector's magnitude, such as approximately $\frac{1}{100}$ or less.

In a structure as in FIGS. 1 and 2, directions that are approximately perpendicular to surface 114 or surface 118 are sometimes referred to as "thickness directions", while directions that are approximately parallel to surface 114 or surface 118 (and therefore approximately perpendicular to thickness directions) are sometimes referred to as "lateral directions". Various techniques could be used to measure carrier mobility in lateral directions and in thickness directions in a given carrier-providing substructure, and it is foreseeable that additional mobility measuring techniques will be discovered, so that the scope of meaning of "negligible transport" and related terms are not limited to measurements made in ways currently known.

In substructure 112, surface part 102 is on electrically conductive region 140, while surface part 104 is on semiconductive channel region 142. An additional feature is suggested by gate part 144, an electrically conductive part that could be in any suitable position in the layered structure and that controls the conductivity of channel region 142, therefore operating as a gate electrode region; more specifically, region 142 is one of a set of semiconductive channel regions in the layered structure, each of which, in response to a respective gate part, operates as an acceptable switch between conductive and nonconductive states for a given application. Specific ways in which this feature can be implemented are illustrated in relation to some of the exemplary implementations described below.

Gate part 144 and similar parts or components In exemplary implementations below are sometimes referred to herein as "gate electrodes", meaning electrodes that operate as gates. Gate electrodes can be produced before other layers that include channels and channel leads; such gate electrodes are often referred to as "bottom gates", and transistor structures that include them are therefore sometimes referred to herein as "bottom gate transistors".

Gate electrodes in bottom gate transistors can provide a directional orientation similar to that described above for top electrodes, but opposite in the sense that a direction away from a bottom gate toward a channel it controls is "up", "over", or "above", while a direction from a channel toward a bottom gate is "down", "under", or "below".

Figure 3:
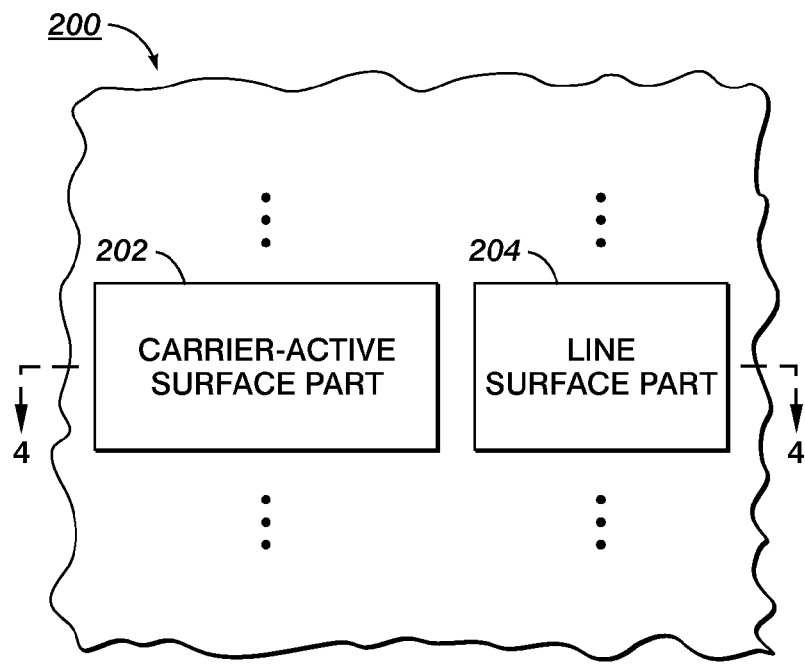
FIG. 3 is a schematic top view of a fragment of a layered structure in which a substructure has carrier-active surface parts and line surface parts.
Figure 4:
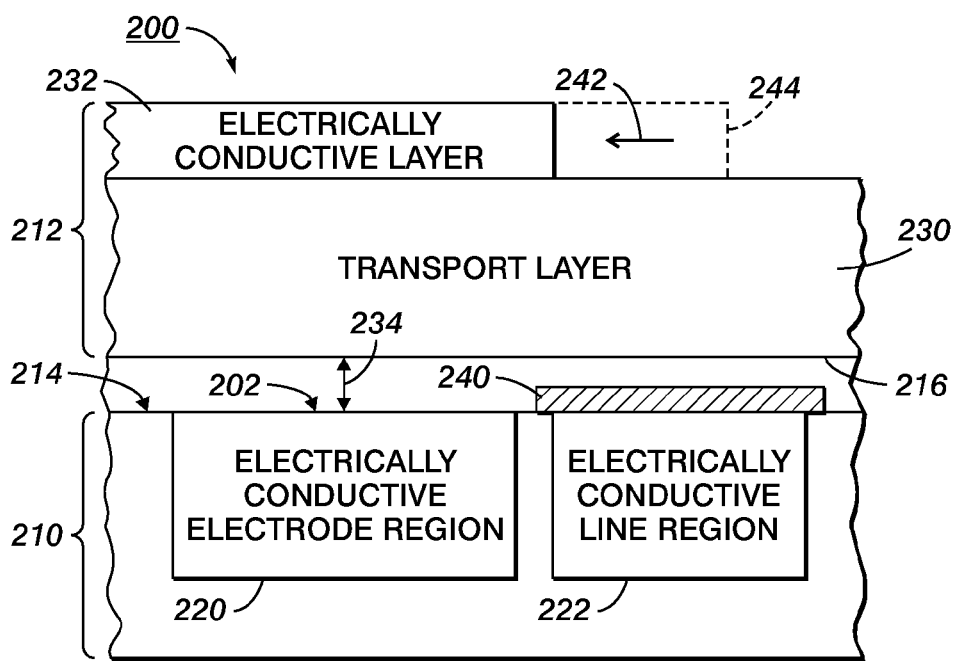
FIG. 4 is a schematic cross section of a fragment as in FIG. 3, taken along the line 4-4 in FIG. 3.

FIGS. 3 and 4 show another example of a layered structure that includes a substructure with two different types of surface parts on two different types of regions; a layered structure as in FIGS. 1 and 2 could also be an example of a layered structure as in FIGS. 3 and 4, and the techniques of FIGS. 3 and 4 can therefore be applicable in FIGS. 1 and 2. Structure fragment 200 includes one or more carrier-active surface parts, with surface part 202 being a representative example, as suggested by the ellipses above and below it. Similarly, structure fragment 200 includes one or more channel surface parts, with surface part 204 being a representative example, as suggested by the ellipses above and below it.

The cross-section of fragment 200 in FIG. 4 shows first and second substructures 210 and 212, with respective surfaces 214 and 216 disposed toward each other. As in FIG. 2, surfaces 214 and 216 are shown slightly separated for illustratively purposes, but they could meet, as in some exemplary implementations described below; also, rather than being approximately flat as shown, surfaces 214 and 216 could each depart from flatness, as in some of the exemplary implementations.

In substructure 210, surface part 202 is on electrically conductive electrode region 220, while surface part 204 is on electrically conductive line region 222. Although regions 220 and 222 could be implemented in the same electrically conductive material, as in some exemplary implementations described below, they operate differently: While line region 222 operates to transfer signals to or from other circuitry, possibly including other parts (not shown) in the same layer of material, electrode region 220 operates as part of another component, illustratively including parts of substructure 212.

Substructure 212 includes transport layer 230, an example of a "charge transport layer". The term "charge transport layer", or simply "transport layer" or "transport layer portion", used herein to refer to a layer through which charge carriers can be transported, such as in response to electric field between electrodes or other parts or components. Similarly, the term "charge generation layer" is used to refer to a layer within which free charge carriers can be generated or produced, such as in response to incident light. These terms are not, however, mutually exclusive, and charge generation and transport could occur in the same layer, such as in different regions or sublayers.

In operation of electrode region 220, charge carriers (not shown) are transported in the thickness direction of transport layer 230 in response to an electric field between electrode region 220 and electrically conductive layer 232. As suggested by bidirectional arrow 234, charge carriers could in principle be transported in either direction, but typically the predominant direction of charge carrier transport depends on the particular implementation, as illustrated by exemplary implementations described below. For example, free charge carriers produced near layer 232 in response to incident light could be transported through transport layer 230 to electrode region 220, or free charge carriers produced near region 220 in response to incident light could be transported through transport layer 230 to layer 232.

Due to signals transferred in line region 222, voltage potential difference can occur between region 222 and layer 232, in which case leakage can occur between region 222 and layer 232, interfering with signal strength or, in other words, introducing noise into signals. FIG. 4 illustrates two techniques that can be used separately or together to prevent leakage between region 222 and layer 232: In one technique, electrically insulating layer portion 240 covers line surface part 204; in another technique, layer 232 has an open region defined in it so that layer 232 does not extend substantially over line surface part 204, as suggested by arrow 242, showing how the edge of layer 232 differs from dashed outline 244 which does extend substantially over line surface part 204. Specific ways in which these techniques can be implemented are illustrated in relation to some of the exemplary implementations described below. The effectiveness of each technique may depend in part on whether transport layer 230 transports charge carriers anisotropically with transport in directions parallel to surface 216 being negligible—in this case, the open region technique may be more effective than it would be in other cases.

Figure 5:
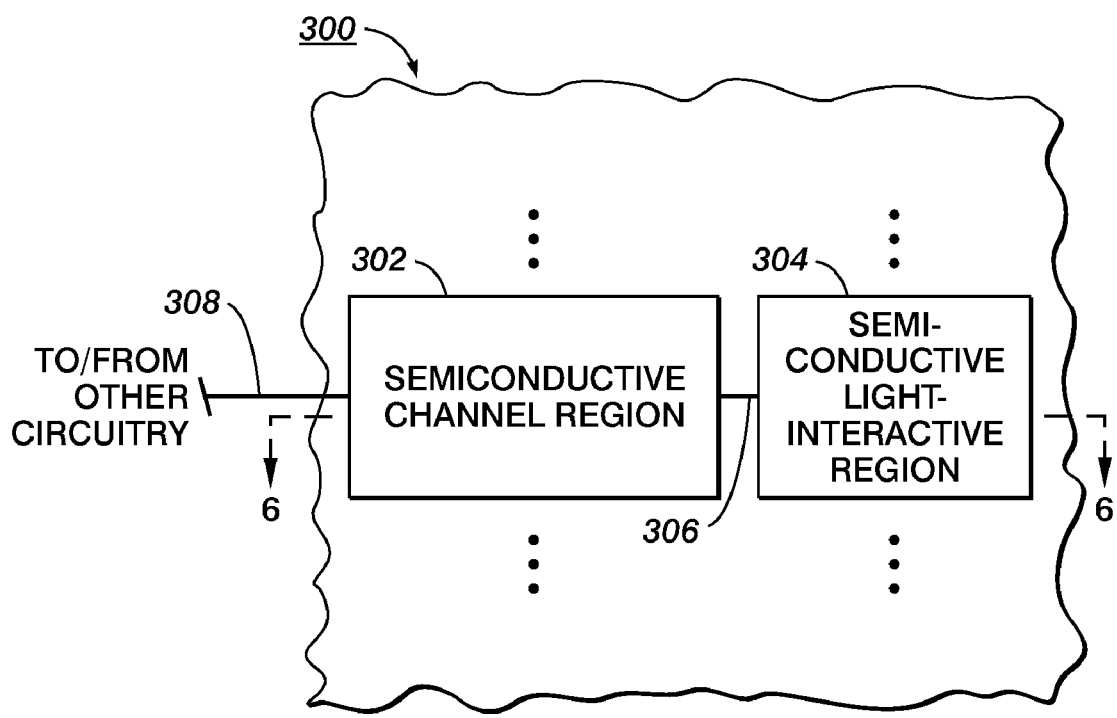
FIG. 5 is a schematic top view of a fragment of a layered structure that includes semiconductive channel regions and semiconductive light-interactive regions.
Figure 6:
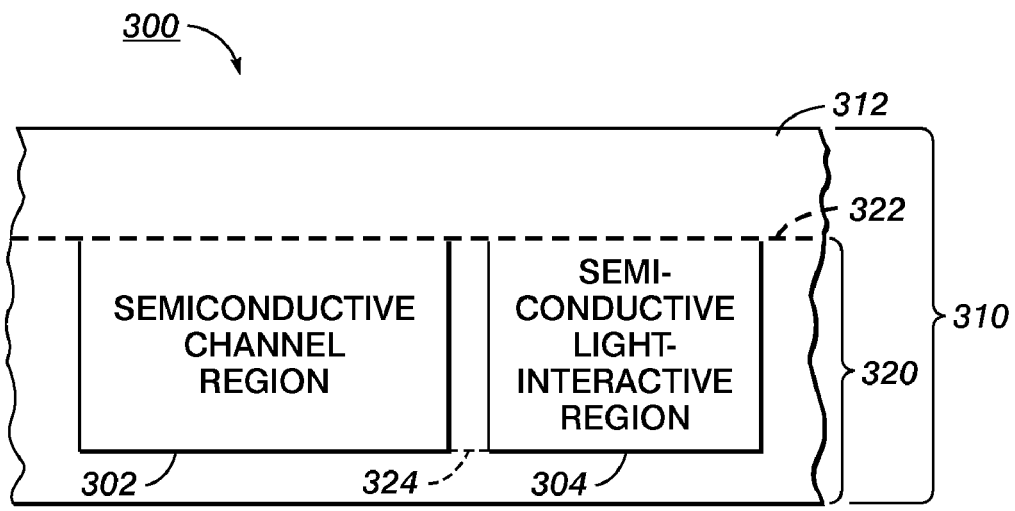
FIG. 6 is a schematic cross section of a fragment as in FIG. 5, taken along the line 6-6 in FIG. 5.

FIGS. 5 and 6 show another example of a layered structure that includes two different types of regions, each of which is semiconductive. Structure fragment 300 includes one or more semiconductive channel regions, with channel region 302 being a representative example, as suggested by the ellipses above and below it. Similarly, structure fragment 300 includes one or more semiconductive light-interactive regions, with light-interactive region 304 being a representative example, as suggested by the ellipses above and below it. Electrical connection 306 between regions 302 and 304 and electrical connection 308 between region 302 and other circuitry make it possible for channel region 302 to operate as a transistor: When channel region 302 is conductive as in a transistor's on-state, it provides an electrical connection between light-interactive region 304 and other circuitry, i.e. circuitry other than region 302 and electrical connections 306 and 308 in the illustrated example.

The term "light-interactive" is used herein to describe an article, component, or part such as a device, array, layer, region, subregion, or other layer part in which interaction occurs between light and matter; a charge generation layer in which free charge carriers are generated in response to light, for example, is a light interactive layer, and there are several other kinds of light interaction, including interactions in which light is emitted or somehow controlled by matter. In operation of a typical photosensing device or array, light interaction results in electrical signals that provide information about light, such as its intensity or photon energy.

In exemplary implementations described below, electrical connection 306 is provided through one or more other parts or components. For example, light-interactive region 304 can be directly on an electrode, with the two meeting at a "contact surface", simply meaning a surface at which two parts or components meet and are in physical contact. Charge carriers can flow across the contact surface due to light interaction; for example, in response to incident light, region 304 might absorb photons, resulting in free charge carriers, and some of the free charge carriers could flow across the contact surface.

A contact surface as described above provides an example of what is sometimes referred to herein as "charge-flow contact", meaning a type of contact at a contact surface between layers, regions, subregions, or other layer parts, with a first, conductive material on one side of the contact surface and a second material that is not always conductive on the other, such as semiconductive material; in general, charge-flow contact permits charge carriers to cross the contact surface even when the second material is not conductive, and occurrence of charge-flow contact may depend on the specific combination of materials that meet at the contact surface.

If the material on the conductive side of charge-flow contact is an electrode region, it is sometimes referred to herein as a "contacting electrode region" or simply a "contacting electrode".

The cross-section of fragment 300 in FIG. 6 shows regions 302 and 304 and their relationship to a surface of fragment 300, which could, for example, be a surface at which the layered structure that includes fragment 300 meets another structure; the other structure could, for example, be another substructure of a larger article that also includes the layered structure. If fragment 300 includes set 310 of layers, then regions 302 and 304 are not exposed at surface 312, but rather are under one or more other layers. If, on the other hand, fragment 300 includes set 320 of layers, then both of regions 302 and 304 are exposed at surface 322, and each of them is under a respective surface part, similarly to surface parts 102 and 104 in FIG. 1. Other variations are also possible, in which one of regions 302 and 304 is exposed and is under a respective surface part while the other is not exposed at a surface. Also, rather than being approximately flat as shown, surfaces 312 and 322 could each depart from flatness, as in some of the exemplary implementations.

As suggested by dashed line 324 extending between their collinear lower surfaces, regions 302 and 304 both include the same semiconductive material, such as a semiconductive polymer material. Because region 302 is a channel region, the material in it must be capable of operating as a channel; for example, in many TFT applications, the material would be required to operate as an acceptable switch in response to a gate electrode, as described in greater detail in co-pending U.S. patent application Ser. No. 11/959,901, entitled "Producing Layered Structures with Layers that Transport Charge Carriers", incorporated herein by reference in its entirety. Similarly, because region 304 is light-interactive, the material in it must be capable of interacting with light, such as by generating free charge carriers in response to incident light. Therefore, the same semiconductive material in both regions 302 and 304 must be a material that is both capable of channel operation and also capable of light interaction.

As used herein, two layers, regions, subregions, or parts, one of which includes a channel and the other of which is light-interactive, are described as including the "same semiconductive material" if they are both semiconductive and if the same constituent materials in both of them provide their channel and light-interactive capabilities; such constituents are sometimes referred to herein as "active constituents". Further, two layers, regions, subregions, or parts, one of which includes a channel and the other of which is light-interactive, are described as including the "same semiconductive polymer material" if they include the same semiconductive material as defined above and if polymer material that is in both of them is one of the active constituents; they could also, of course, include non-polymer materials such as binding matrix material, dopants, impurities, and so forth and, any non-active constituents could be different between the two of them. Furthermore, two such regions have the same semiconductive material despite small differences in the active constituents, such as the types of differences that could occur between two batches of a material produced at different times or places or in different ways, or between two examples of a single batch of material that have been stored for different amounts of time, processed differently, in contact with different neighboring materials or other environmental conditions, and so forth.

Although regions 302 and 304 could have been produced in various ways, such as with photolithography or printing, they can both be produced by a process appropriate to the semiconductive material they share, which could advantageously reduce the number of operations or the number of different processes necessary to produce the layered structure. This advantage is illustrated by the example of two regions produced from a single reservoir of material deposited and patterned in the same way during a single operation or continuing series of operations—this example also illustrates one of the many ways in which two regions could have the same semiconductive material.

Figure 7:
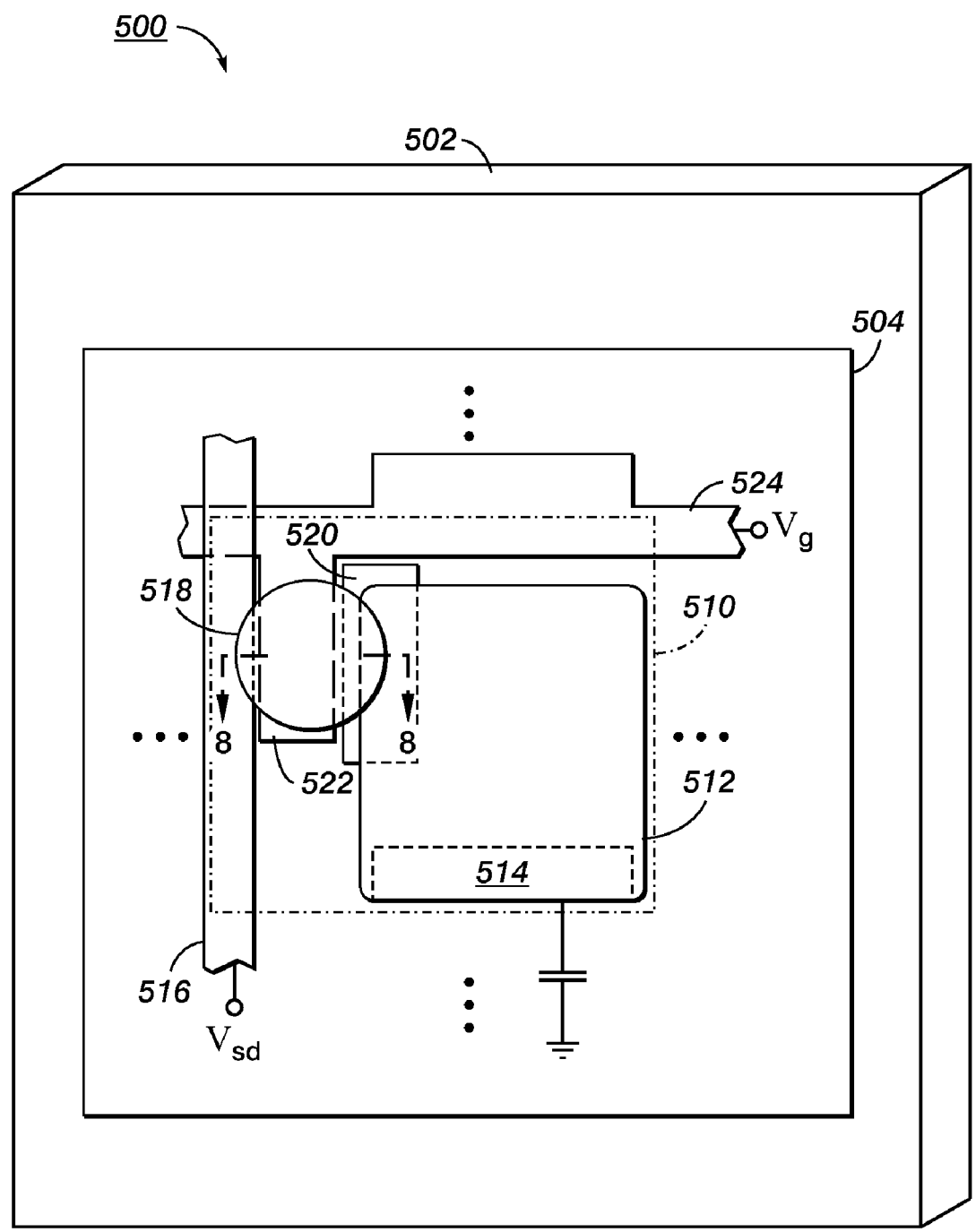
FIG. 7 is a schematic top view of an IC that includes a photosensing array.

FIG. 7 illustrates IC 500, an integrated structure that includes at least one substrate 502 and array 504, implemented with one or more of the features described above in relation to FIGS. 1-6. Array 504 includes an arrangement of cells, one or more of which could, for example, photosense light; in other implementations, a set of the cells could interact with light in other ways, such as by emitting light or by acting as a light valve. Such an IC could be implemented, for example, as a large-area visible or x-ray image sensor, and could be used in any of a wide variety of applications, such as in consumer electronics, medical imaging, inspection of structural components as in aircraft, security imaging as in airport luggage scanners, and so forth. IC 500 could be implemented, for example, with an active matrix TFT backplane and a photosensor layer. The active material in the TFTs and in the photosensor layer can include semiconductor polymer material, such as a low-cost semiconductive organic polymer material; a TFT with a channel that includes organic polymer material is sometimes referred to herein as an "organic TFT" or simply an "OTFT".

Various fabrication techniques could be used to produce IC 500. For example, metal layers can be deposited by sputtering, for example, and layers of dielectric and semiconductive materials can be deposited by plasma-enhanced chemical vapor deposition (PE-CVD). Organic polymer photosensor layers can, for example, be vapor deposited or dip-coated on backplanes, after which a top conductive layer can be deposited; alternatively, a patterned sheet with organic polymer photosensor and a top conductive layer can be laminated onto an OTFT backplane. An OTFT backplane with organic polymer channels can be produced by vapor depositing and then patterning semiconductive organic polymer material.

Substrate 502 could, for example, be glass, plastic, or another insulating material suitable for microfabrication of electronic components on its surface. For rigidity, substrate 502 could be implemented with a rigid substrate such as glass. For flexibility, substrate 502 (and any other substrates in IC 500) could be implemented with mechanically flexible plastic material and each layered structure could be implemented with suitably thin inorganic layers to reduce mechanical stresses on the substrate(s). Further, a thin inorganic layer on the substrate could operate as a moisture barrier, protecting the substrate.

Although a-Si can be processed on a glass substrate with high temperatures, most currently available flexible substrates are susceptible to damage at high temperatures, and may require deposition processes at low temperatures, such as not exceeding approximately 200 degrees C. or another appropriate limit. More specifically, substrate 502 could be a "low-temperature substrate", meaning a substrate that is damaged if exposed to temperatures that are reached during some microfabrication processes, with the specific temperature above which damage occurs being determined by substrate material(s) and semiconductor material(s) and typically being available from a manufacturer's specifications for its materials; a low-temperature plastic substrate made of Kapton® would be typically damaged by temperatures in excess of 300 degrees C., but many plastic substrates would be damaged by temperatures in excess of lower temperatures, with some damaged by temperatures as low as 150 degrees C., and so forth.

Substrate 502 could also be a "mechanically flexible substrate", meaning a substrate that has sufficiently small thickness that it can be flexed in lateral directions, i.e. directions approximately perpendicular to its thickness direction. An example of a mechanically flexible substrate that is advantageous due to low surface roughness is polyethylene napthalate. If sufficiently flexible, for example, substrate 502 could be rolled up, such as for roll-to-roll processing or web processing, in which case substrate 502 might be a large area substrate, such as a few meters in width and many meters in length.

The above are merely illustrative examples of materials, substrates, fabrication techniques and parameters, and so forth. Various other specific examples are described below in relation to exemplary implementations, and it is foreseeable that techniques described herein could be implemented with various future-developed materials, substrates, fabrication techniques and parameters, and so forth.

Array 504 could be one of several arrays fabricated on substrate 502. Within array 504, illustrative cell 510 is shown as an area of array 504 within which a transistor structure is connected to cell electrode 512. In the illustrated example, cell electrode 512 could, for example, operate as an electrode of a capacitive component, with extension 514 of an adjacent gate line (not shown) operating as the other electrode, sometimes referred to herein as a "paired electrode" or, if a region, subregion, or other layer part, as a "paired electrode region".

Electrical connection of cell electrode 512 to conductive line 516 can be controlled by controlling conductivity of a channel in layer part 518, part of a layer of semiconductive material. Layer part 518 extends between two connecting points, at one of which it is electrically connected to electrode 512, such as through channel end electrode 520, and at the other of which it extends over and is electrically connected to a part of line 516, which operates as its other channel end electrode. Layer part 518 thus includes a channel portion whose conductivity is controlled by bottom gate electrode 522, an extension of conductive line 524 so that signals on line 524 control conductivity of the channel portion by changing voltage on electrode 522. As a result, line 516 can provide signals to and/or receive signals from cell electrode 512 when the channel portion is conductive due to signals on line 524.

Although layer part 518 illustratively includes only one FET in which conductivity of a channel portion is controlled by electrode 522, a wide variety of other transistor structures could be used in cell 510. For example, transistor structures for CMOS image sensors have been proposed with various combinations of channels, sometimes referred to as "1T" if one channel, "2T" if two, and so forth. Similarly, multiple channel transistor structures have been proposed for each cell of an active matrix array, such as for displays and other light transmissive, sensing, or emitting applications.

Figure 8:
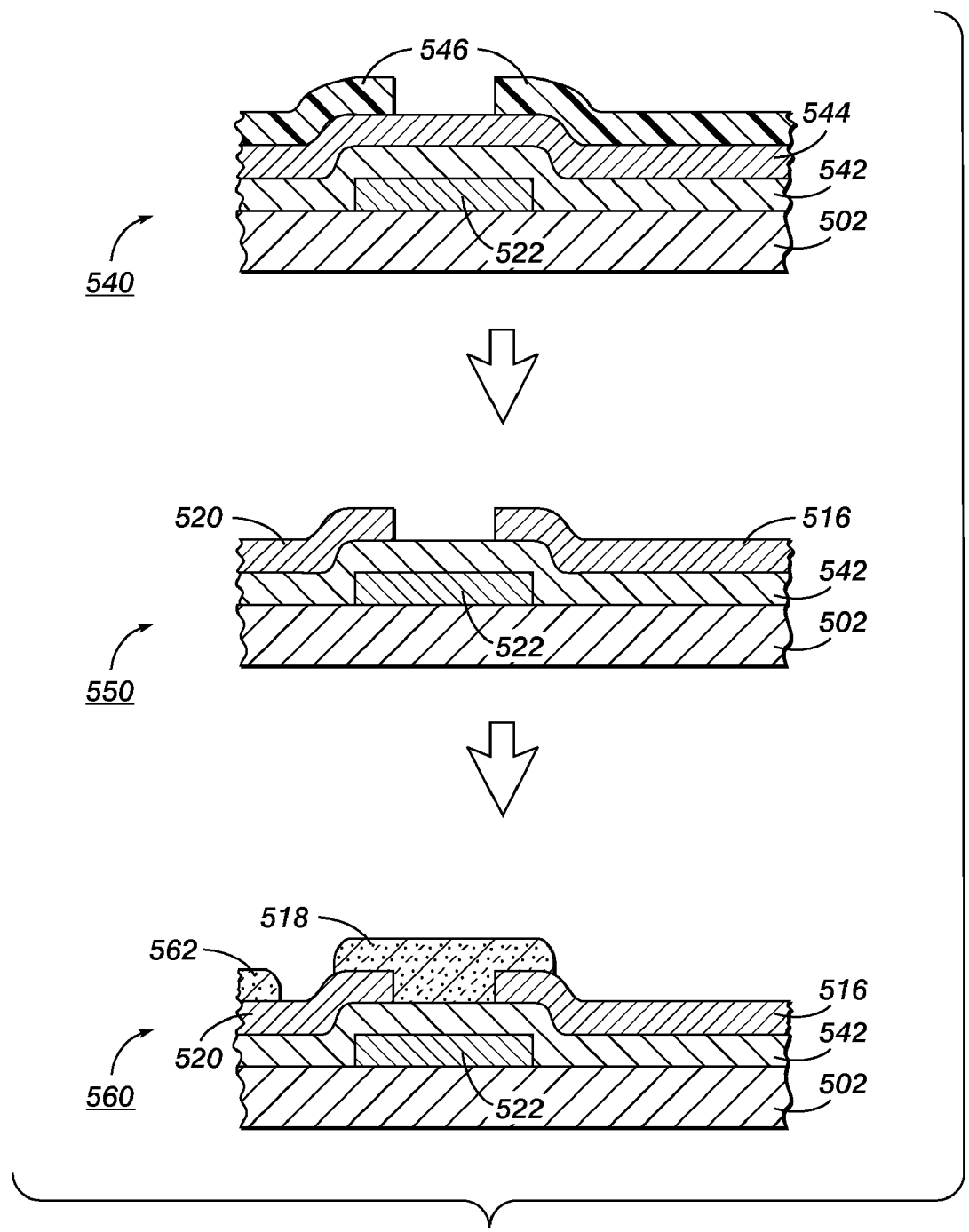
FIG. 8 shows a sequence of cross sections in producing an organic thin film transistor (OTFT) for an IC as in FIG. 7, taken along the line 8-8 in FIG. 7.

FIG. 8 shows a sequence of cross sections illustrating stages in producing active layers of IC 500, but with layer thicknesses not to scale. More particularly, the illustrated stages show production of a bottom gate transistor structure with channel end electrodes under a semiconductive layer that includes a channel portion. Additional stages before, after, and during the illustrated stages could be performed using any suitable operations, and it is foreseeable that additional and alternative operations for producing an IC with features as in FIG. 7 will be developed in the future.

Cross section 540 shows gate electrode 522 on substrate 502, with additional layers deposited over electrode 522. As noted above, substrate 502 could be any suitable insulating substrate material, such as glass, plastic, and so forth. In some implementations described herein, substrate 502 is a mechanically flexible, large area, low-temperature substrate material, such as a polymer layer or a very thin silicon nitride layer on top of a polymer layer, for example. Currently available candidate polymer materials include polyethylene napthalate, polyimide (for example Dupont Kapton® and others), polyester, and so forth, and it is foreseeable that other suitable substrate materials will be developed that could be used within the scope of the invention.

Gate electrode 522 can be printed, photolithographically patterned, or otherwise patterned directly on or over substrate 502 or another suitable support surface in one or more layers with an appropriate thickness using any suitable conductive material, such as chromium, aluminum, or other highly conductive metal or metal alloy, doped semiconductive material, a conductive combination of materials, or, if printed such as by jet printing, any suitable nanoparticle metal. It might also be possible to apply the techniques described herein to a bottom gate transistor structure with a semiconductor substrate in which the bottom gate is a heavily doped region, such as a p-type region of a silicon substrate, with a highly conductive back contact such as gold.

Gate dielectric layer 542 is illustratively on gate electrode 522, and could be implemented in any way consistent with a bottom gate transistor. For example, gate dielectric 542 can be implemented by depositing one or more layers of any suitable dielectric material or dielectric combination of materials on or over gate electrode 522 and other gate electrodes in array 504. Any of a wide variety of dielectric materials could be used, with an oxide or nitride of silicon (e.g. $SiO_2$ or $Si_3N_4$) being suitable, for example, if gate electrode 522 is chromium and with aluminum oxide ($Al_2O_3$) being suitable, for example, if gate electrode 522 is aluminum. Also, if printed such as by jet printing, gate dielectric layer 542 could include a suitable organic polymer dielectric. In general, gate dielectric layer 542 should be produced in such a way that its upper surface is suitable for subsequent production of the layered structure over it.

An active layered structure or substructure is then fabricated on gate dielectric layer 542, illustratively by depositing conductive layer 544 and then depositing and patterning a layer of resist to produce patterned layer parts 546. Conductive layer 544 can, for example, be a highly conductive material such as gold, deposited using sputtering or other suitable techniques, currently available or hereafter developed. The resist layer can similarly be any currently available or hereafter developed resist material, such as a photolithographically patterned photoresist material or a printed resist material.

Cross section 550 shows the result of then etching away exposed portions of layer 542, such as with a suitable wet etchant, and then removing layer parts 546, such as with a solvent, leaving conductive line 516 and channel end electrode 520 on gate dielectric layer 544. Alternatively, conductive line 516 and channel end electrode 520 could be produced by printing, such as by jet printing a suitable nanoparticle metal.

Cross section 560 shows the result of then producing semiconductive layer parts 518 and 562. Layer part 518 is over the exposed portion of gate dielectric layer 542 between conductive line 516 and electrode 520, and operates as a channel region. Layer part 562 is illustratively on electrode 520, and operates as a light-interactive region; for example, layer part 562 could respond to incident light by providing free charge carriers that are transported toward or away from electrode 520. Layer parts 518 and 562 could, for example, be a suitable organic polymer semiconductive material, printed such as by jet printing, in which case the active layers would include an OTFT. Although parts 518 and 562 are not shown as a continuous layer part in FIG. 8, they may often be conveniently formed as a continuous layer part, with their different operations resulting from other layer parts that are above, below, or otherwise nearby each of them. In the illustrated example, parts 518 and 562 are both on electrode 520, e.g. conductive metal, so that they can be electrically connected during operation even if there is a break between them.

Organic polymer materials that have been successfully used in such implementations include polythiophenes, e.g. poly(3-hexylthiophene) and poly(3,3'''dialkylquaterthiophene) (PQT-12), and co-polymers, e.g. poly(2,5-bis(3-dodecylthiophen-2yl)thieno[3,2-b]thiophene) (PBTTT) and poly(9,9-dioctylfluorene-alt-benzothiadiazole) (F8BT), and it is believed that various other currently available or future-developed organic polymers could be used. Alternatively, layer part 518 could be produced by photolithographic patterning of an appropriate semiconductive polymer material and suitable backplanes for one or more of the techniques in FIGS. 1-6 could include various other geometries; for example, each of conductive line 516 and channel end electrode 520 are illustratively under an end region of layer part 518 but could be positioned in various other ways to provide electrical connections to ends of a channel portion, such as on layer part 518 or somehow abutting it, provided fabrication constraints are not violated. Furthermore, although conductive line 516 both operates as a data line and also includes a region that operates as a channel end electrode, a layer part separate from line 516 could operate as the channel end electrode.

Techniques as in FIG. 8 have been successfully implemented to produce OTFTs and OTFT backplanes. Compatible combinations of materials mentioned above have been found. It is foreseeable, however, that various other techniques for producing OTFTs and OTFT backplanes, such as with other combinations of materials, will be developed in the future, and use of such techniques would be within the scope of the invention. Furthermore, as noted above, inorganic semiconductor polymer materials could also be used within the scope of the invention.

Figure 9:
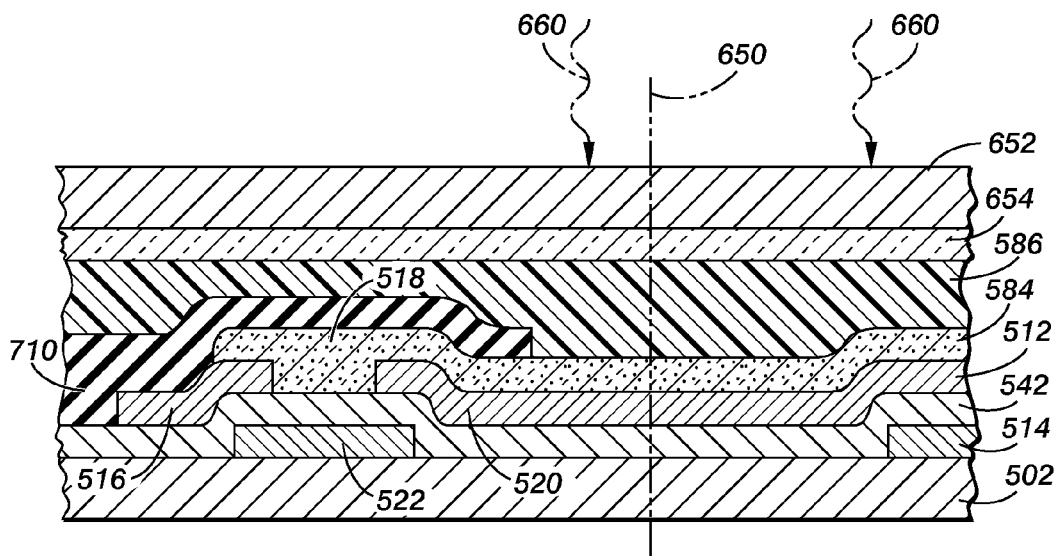
FIG. 9 is a partially schematic cross section of a cell region in an exemplary implementation of an IC as in FIG. 7.
Figure 10:
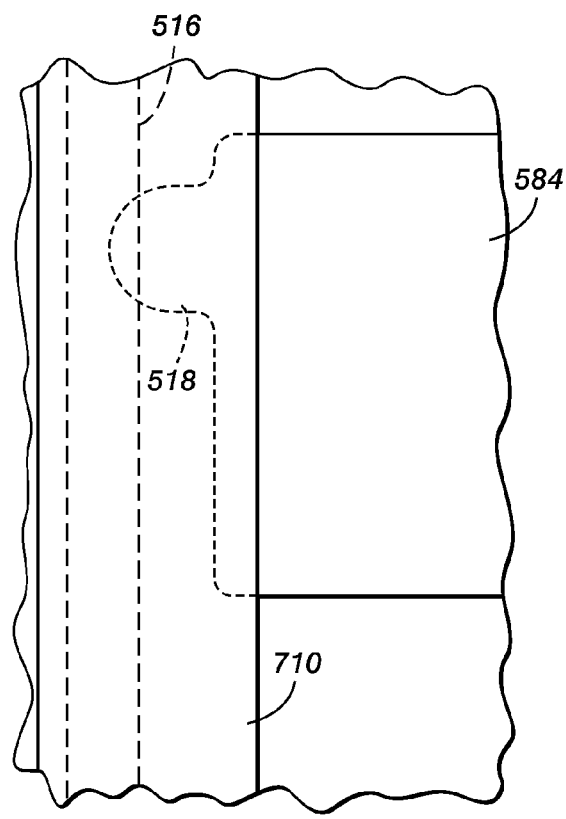
FIG. 10 is a top plan view of encapsulation over a data line and an OTFT channel in a layout that can be used in implementations as in FIG. 9.

The exemplary implementations in FIGS. 9-10 illustrate features of an exemplary photosensor structure that can be used to implement IC 500 (FIG. 7). Except as otherwise noted, layers and layer parts in FIGS. 9-10 are labeled with the same reference numerals as in FIGS. 7-8 and can be similarly implemented. FIG. 9 is a cross section, such as through a cell region similar to that in FIG. 7, and FIG. 10 is a top view.

The cross section in FIG. 9 illustrates a cell region that can perform photosensing in response to illumination through a top electrode, also referred to as "top illumination". The cross section is taken in the opposite direction or taken of cell regions that are mirror images or other variations of the cell region in FIGS. 7 and 8, with conductive line 516 at left and channel end electrode 520 at right in the OTFT. Also, the cross section includes electrode 514 at far right, which could be seen in cross sections of the cell region of FIGS. 7 and 8 if each cross section makes a bend at intersecting line 650.

In FIG. 9, cell electrode 512 meets and is electrically connected to channel end electrode 520, and is therefore electrically connected to conductive line 516 when the channel in layer part 518 is conductive. More specifically, cell electrode 512 can be integrally formed with electrode 520 in the same layer of conductive material.

In FIG. 9, which illustrates an example of features shown in FIGS. 3-6, layer part 518 and charge generation layer (CGL) 584 both include the same semiconductive polymer material, and therefore can, if appropriate, be formed in parallel such as by photolithography or in sequence during a single operation such as by printing. Both layer part 518 and CGL 584 are illustratively shown in the same continuous layer of material, although they could be separated parts of the same layer as in FIG. 8 or parts of different layers of the same semiconductive polymer material.

CGL 584 is directly on cell electrode 512, and the two have surfaces that meet at a contact surface. In response to incident light, CGL 584 absorbs photons, resulting in free charge carriers, and charge carriers can flow across the contact surface between CGL 584 and electrode 512 through the phenomenon of charge-flow contact, described above. Cell electrode 512 is therefore an example of a contacting electrode in charge-flow contact with CGL 584, as well as being electrically connected to the channel region in layer part 518. Electrode 512 therefore provides electrical connection between CGL 584 and the channel in layer part 518.

The semiconductive polymer material in layer part 518 and CGL 584 could, for example, be any of various semiconductive organic polymers that are available for TFT channels and that can operate as a CGL with an appropriate charge transport layer. Layer part 518 could, for example, be a suitable organic polymer semiconductive material, printed such as by jet printing, in which case the active layers would include an OTFT. Organic polymer materials that are expected to be successful in such implementations include photoconductive polythiophenes, e.g. poly(3,3'''dialkylquaterthiophene) (PQT-12), and photoconductive co-polymers, e.g. poly(2,5-bis(3-dodecylthiophen-2yl)thieno[3,2-b]thiophene) (PBTTT), and it is believed that various other currently available or future-developed photoconductive organic polymers could be used. Layer part 518 and CGL 584 could be produced, for example, as a dispersion of a semiconductive organic material in a binding matrix. More generally, it may be possible to implement another light-interactive component rather than CGL 584 with the same semiconductive polymer material as layer part 518, or to implement two other types of subregions with the same semiconductive polymer material, with one subregion including a channel and the other being light-interactive.

Above and on CGL 584 is charge transport layer (CTL) 586, a transparent or light-transmissive layer that operates to split charge carrier pairs from CGL 584 and to transport charge carriers of one type from CGL 584 upward in response to an electric field, resulting in a photocurrent. The electric field is produced by applying a voltage across cell electrode 512 and a top electrode layer as described below, to facilitate charge separation and transport. Various materials could be used to implement CTL 586 in photosensor structures as in FIG. 9. For example, CTL 586 can be a hole transport layer that includes a conductive polymer material, such as N,N'-diphenyl-N,N'bis(3-methylphenyl)-(1-1'-biphenyl)-4,4'-diamine (TPD), dispersed in an insulating matrix such as polycarbonate, or an electron transport layer that includes a conductive organic material such as alkylated-4,-4'diphenoquinones (DPQ) dispersed in an insulating matrix such as polycarbonate.

In the illustrated implementation, substrate 652 at the top can be made of glass, plastic, or other suitable material, and top electrode 654 can be part of a patterned layer of light-transmissive or transparent conductive material such as ITO or conductive CNT material, deposited on substrate 652, with direct jet-printing being appropriate if transparent conductors such as CNT dispersions are available.

In FIG. 9, opaque, electrically insulating encapsulant 710 could be implemented with a light absorbent dielectric material, patterned so that it extends not only over conductive line 516 but also over layer part 518, which includes the OTFT's channel, but not entirely over CGL 584. It could, for example, be photolithographically patterned or printed, such as with a printable wax material of the type used for digital lithography or other printable opaque dielectric polymer material. Encapsulant 710 could be any appropriate encapsulant material, and can include, for example, organic polymer and/or inorganic polymer; examples that may be appropriate to block infrared light in different contexts include parylene, poly(methyl methacrylate) (PMMA), polystyrene, epoxy SU-8, polyvinyl phenol, and various other organic polymers as well as poly (methylsilsesquioxane), siloxane, and various other types of inorganic polymers. In some cases these layers may include additives to reduce transmittance of visible wavelength light, e.g. so called "black polyimide" (available as DARC®400 from Brewer Science, Inc., Rolla, Mo.) that is often used in a matrix in color filter applications.

In the illustrated implementation, encapsulant 710 not only prevents leakage current between top electrode 654 and conductive line 516 but also acts as a light shield that protects the channel in layer part 518 from contact with CTL 586 and from incident light. Protection from incident light is necessary in such an implementation because using the same materials for TFT and CGL requires that the TFT be insensitive to light in order to be an acceptable switch for typical applications. Alternative or additional light shielding measures include, for example, forming a black layer or an opaque metal region on substrate 652, aligned as encapsulant 710 is in FIG. 9.

In operation of the cell region in FIG. 9, incident light, illustrated by rays 660, enters through substrate 652, passes through top electrode 654 and CTL 586, and is absorbed in CGL 584, producing charge carrier pairs. CTL 586 operates to separate free charge carriers and transport them from CGL 584 toward top electrode 654, producing photocurrent that either increases or decreases stored charge in a capacitive component that includes part of electrodes 512 and could include part of electrode 514 or, more elegantly, parts of CTL 586 and top electrode 654 over electrode 512. In this way, the cell region can capacitively store a signal level determined by the magnitude of stored charge. In general, the magnitude of stored charge therefore indicates intensity of illumination at the location of the illustrated cell region, and a stored signal level indicating illumination intensity can therefore be read out through conductive line 516 by turning on the OTFT in accordance with suitable array readout techniques. For example, readout could be implemented with CMOS or CCD readout techniques and other currently available techniques and could also foreseeably include future developed readout techniques that read out a voltage or current signal.

FIG. 10 shows an encapsulant pattern that can be used to implement ICs with encapsulant 710 as in FIG. 9. Top electrode 654 and CTL 586 are not shown in FIG. 10 because they are not patterned and are therefore present throughout the illustrated area; certain other layers and layer parts are also omitted because not relevant to the illustrated features.

Layer part 518 extends over and is electrically connected to conductive line 516, but both are shown in dashed line in FIG. 10 because both are under encapsulant 710. The patterned layer of semiconductive polymer material that includes layer part 518 also includes, however, CGL 584, which illustratively connects to layer part 518 and extends from there out from under encapsulant 710, so that it can receive incident light from top illumination even though the channel in layer part 518 is protected from incident light. Encapsulant 710 extends in a lateral direction over conductive line 516, covering the channels of OTFTs in a line of cell regions along conductive line 516. This geometry avoids the need to pattern encapsulant 710 separately for each cell region.

Figure 11:
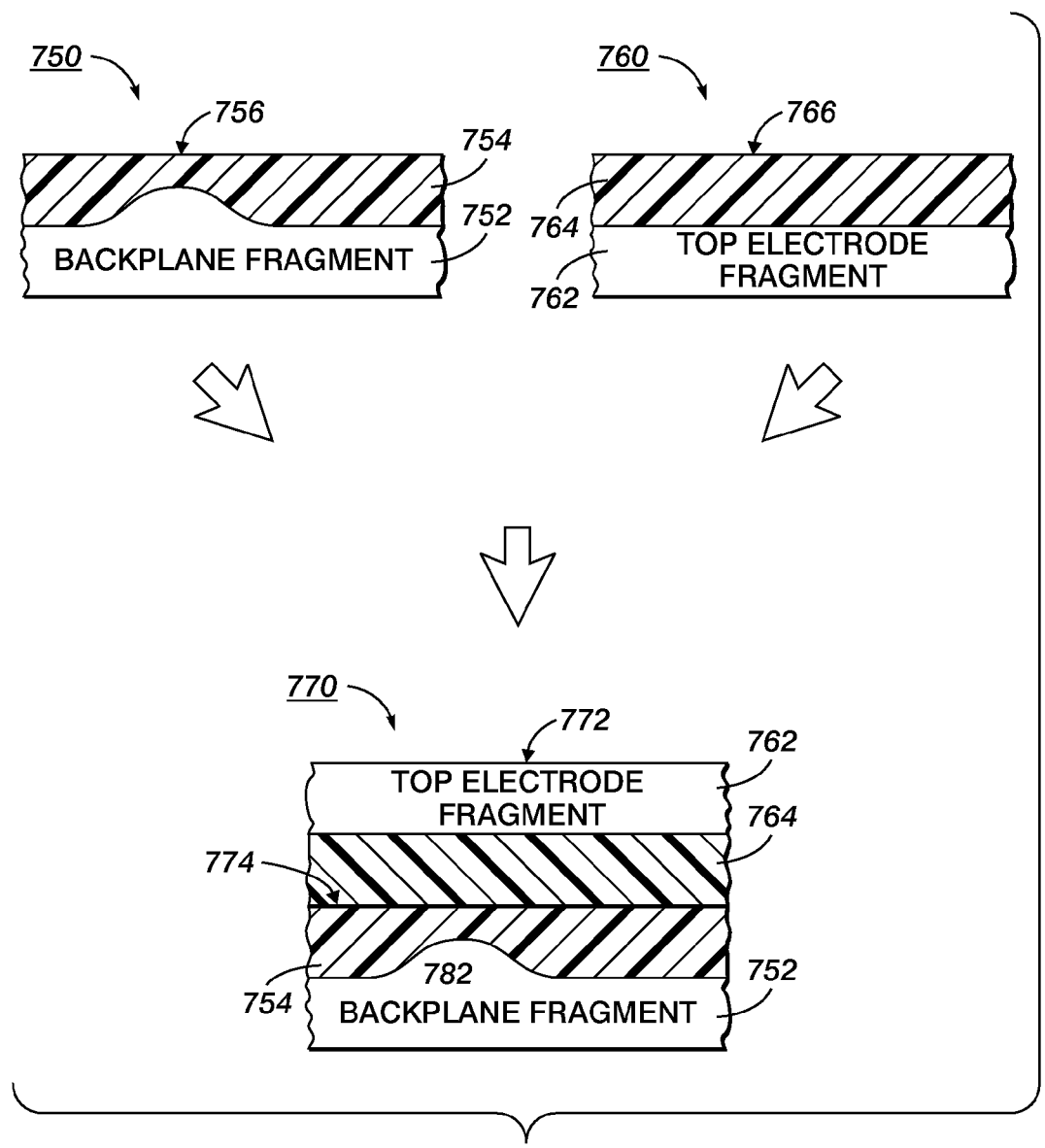
FIG. 11 shows cross sections in a lamination technique that can be used to produce an IC as in FIG. 7.
Figure 12:
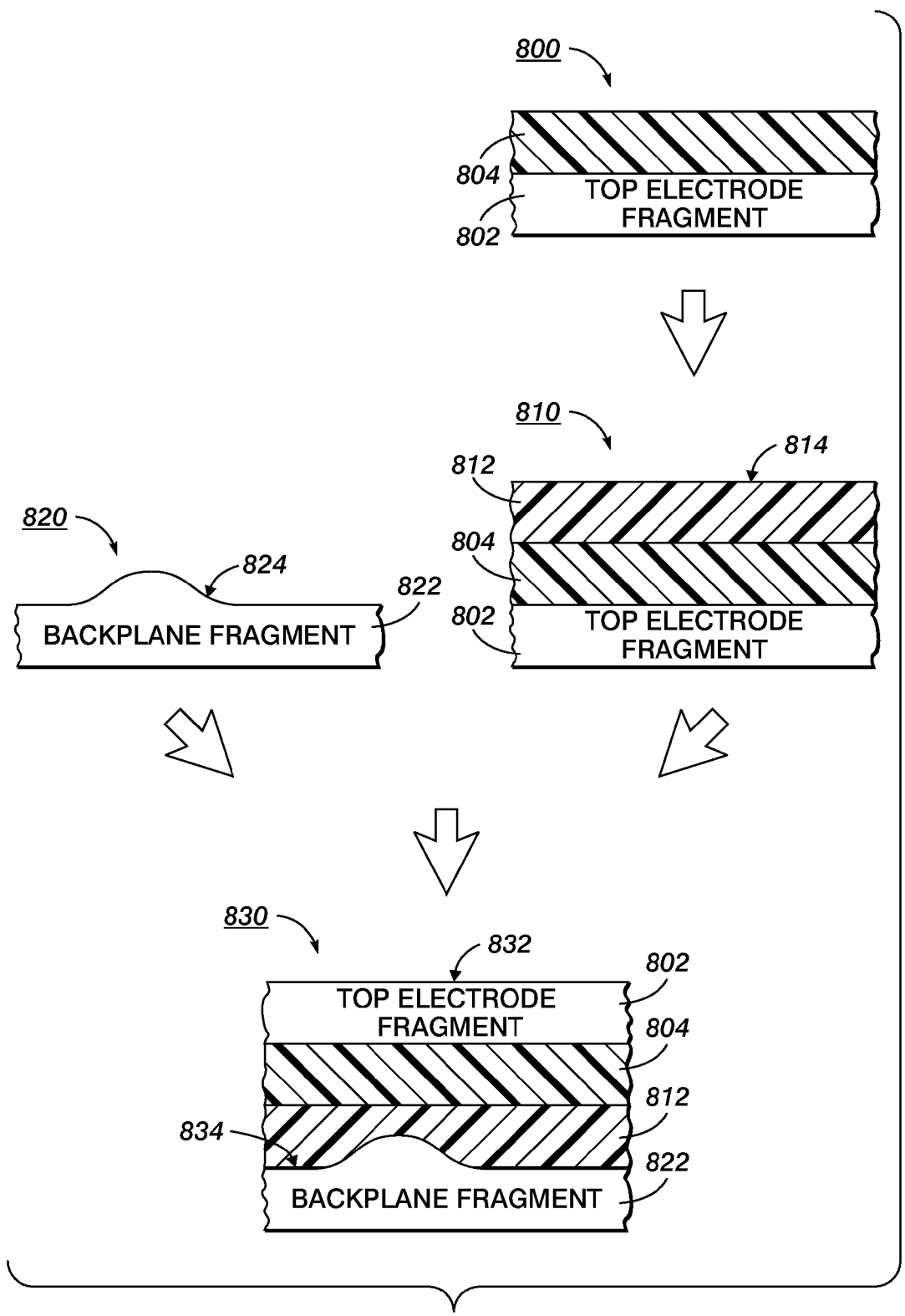
FIG. 12 shows cross sections in another lamination technique that can be used to produce an IC as in FIG. 7.
Figure 13:
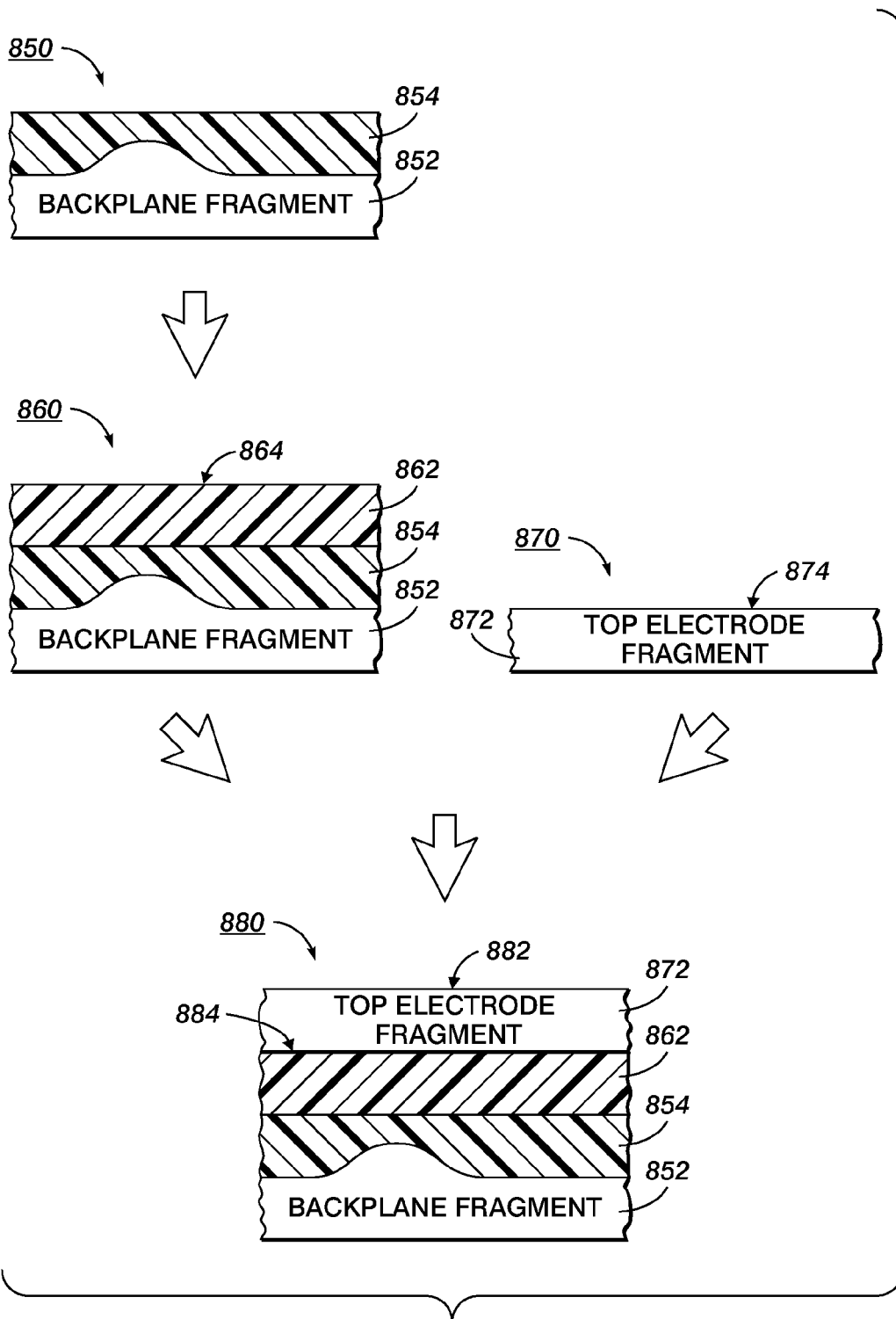
FIG. 13 shows cross sections in another lamination technique that can be used to produce an IC as in FIG. 7.

FIGS. 11-13 illustrate lamination techniques that can, with suitable modifications, be used to produce ICs as described above in relation to FIGS. 7-10.

In the lamination technique of FIG. 11, surfaces of two polymer-containing layers meet at an interface surface. The two polymer-containing layers are produced separately before lamination, such as by solution processing, and, in addition to solution processing artifacts, lamination artifacts of various kinds could occur on either of the polymer-containing layers, such as at the interface surface, or in either of the polymer-containing layers. Further details about lamination and lamination artifacts are described in co-pending U.S. patent application Ser. No. 11/959,187, entitled "Producing Layered Structures with Lamination", incorporated herein by reference in its entirety.

As shown in cross section 750, backplane fragment 752, shown in outline for generality, is from an IC with an array in which cell regions include OTFTs. Such an IC could be implemented in any of the ways described above or in other suitable ways. Polymer-containing layer 754 has been produced over backplane fragment 752, such as by spin-coating or dip-coating a CTL, a CGL, or part of a CTL or by another suitable solution processing technique. Alternatively, a xerographic CTL or CGL in sheet form could be laminated onto backplane fragment 752 to produce layer 754. In any case, layer 754 has surface 756 suitable for lamination.

As similarly shown in cross section 760, top electrode fragment 762, also shown in outline for generality, could be implemented in any of the ways described above or in other suitable ways. Polymer-containing layer 764 has been produced over top electrode fragment 762, such as by a suitable solution processing techniques such as spin-coating or dip-coating a CGL, a CTL, or another part of a CTL where part of the CTL has already been spin-coated on backplane fragment 652. Alternatively, a xerographic CGL or CTL in sheet form could be laminated onto top electrode fragment 762. Like layer 754, layer 764 has surface 766 suitable for lamination.

Cross section 770 shows the result of lamination, in which IC fragment 772 includes backplane fragment 752, top electrode fragment 762, and both of polymer-containing layers 754 and 764. In this implementation, interface surface 774 occurs where surfaces 756 and 766 meet, between layers 754 and 764.

In the lamination technique of FIG. 12, a surface of a polymer-containing layer meets a surface of a backplane at an interface surface. Polymer-containing layers are produced on top electrode layers before lamination, such as by solution processing, and, in addition to solution processing artifacts, lamination artifacts of various kinds could occur at the interface surface or in the polymer-containing layer whose surface meets the backplane surface.

As shown in cross section 800, top electrode fragment 802 has polymer-containing layer 804. Layer 804 could be produced on top electrode fragment 802, such as by a solution processing technique such as spin-coating or dip-coating, or by laminating a CGL or a CTL. As shown in cross section 810, polymer-containing layer 812 has been produced on layer 804, again such as by a solution processing technique such as spin-coating or dip-coating, or by laminating a CTL or a CGL. As an alternative, layers 804 and 812 could be concurrently laminated to fragment 802 in sheet form. In any case, layer 812 has surface 814 suitable for lamination.

As shown in cross section 820, backplane fragment 822 does not have a polymer-containing layer over its surface 824 prior to lamination. But surface 824 must be suitable for lamination with surface 814.

Cross section 830 shows the result of lamination, in which IC fragment 832 includes backplane fragment 822, top electrode fragment 802, and both of polymer-containing layers 804 and 812. In this implementation, interface surface 834 occurs where surfaces 814 and 824 meet, between layer 812 and the backplane.

In the lamination technique of FIG. 13, a surface of a polymer-containing layer meets a surface of a top electrode at an interface surface. Polymer-containing layers are produced on a backplane before lamination, such as by solution processing, and, in addition to solution processing artifacts, lamination artifacts of various kinds could occur at the interface surface or in the polymer-containing layer whose surface meets the top electrode surface.

As shown in cross section 850, backplane fragment 852 has polymer-containing layer 854. Layer 854 could be produced on backplane fragment 852, such as by a solution processing technique such as spin-coating or dip-coating, or by laminating a CTL or a CGL. As shown in cross section 860, polymer-containing layer 862 has been produced on layer 854, again such as by a solution processing technique such as spin-coating or dip-coating, or by laminating a CGL or a CTL. As an alternative, layers 854 and 862 could be concurrently laminated to fragment 852 in sheet form. In any case, layer 862 has surface 864 suitable for lamination.

As shown in cross section 870, top electrode fragment 872 does not have a polymer-containing layer over its surface 874 prior to lamination. But surface 874 must be suitable for lamination with surface 864.

Cross section 880 shows the result of lamination, in which IC fragment 882 includes backplane fragment 852, top electrode fragment 872, and both of polymer-containing layers 854 and 862. In this implementation, interface surface 884 occurs where surfaces 864 and 874 meet, between layer 862 and the top electrode.

Techniques similar to those described herein have been successfully tested by fabricating a device with channel regions and light-interactive regions having the same semiconductive polymer material. Satisfactory photoresponse for light-interactive regions and acceptable dark current and switching operation for channel regions have been obtained. The techniques described above are therefore expected to provide a robust way to make devices, arrays, and other products, including various additional products besides the specific types mentioned herein.

The techniques described above are advantageous because they make it possible to produce a layered structure that includes channel regions and light-interactive regions of the same semiconductive polymer material, simplifying fabrication. Solution processing can be used to produce the semiconductive material. Fabrication can be further simplified with lamination. These techniques are particularly applicable to light-interactive applications such as photosensing arrays such as active matrix OTFT image sensors, but could be applied in various other contexts.

The exemplary implementations described above are illustrated with specific shapes, dimensions, and other characteristics, but the scope of the invention includes various other shapes, dimensions, and characteristics. For example, the particular shapes of layer parts in a layered structure could be different, and could be of appropriate sizes for any particular array or other device. Furthermore, rather than being produced with the particular printing or photolithographic operations as described above, arrays and other devices as described above could be produced with various other operations and could include layered structures with various other materials and characteristics. Patterning of layers could similarly be performed with printing, photolithography, or any other suitable operations.

Similarly, the exemplary implementations described above include specific examples of semiconductive polymer materials, but any appropriate semiconductive polymer materials could be employed. Further, the above exemplary array implementations employ specific cell geometries, but a wide variety of other such geometries could be used within the scope of the invention. The invention is not limited to the specific examples of cell circuitry described above, but could be used with other cell circuitry that performs photosensing, other light interactions, or other operations. For example, the exemplary implementations include top electrodes and, under the channels, gate electrodes, but the techniques could be implemented with other techniques, possibly without top electrodes and possibly with gates of different types or in different positions. Furthermore, the fabrication techniques described above could be used to produce an incomplete structure, which could then be marketed for completion and inclusion in a finished product.

While the invention has been described in conjunction with specific exemplary implementations, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:
1. A layered structure comprising:
a set of semiconductive regions including:
one or more channel regions; and
one or more light-interactive regions; and
a contacting electrode region in charge-flow contact with a first one of the light-interactive regions;

when conductive, a first one of the channel regions providing an electrical connection between the contacting electrode region and other circuitry, and the first channel region and the first light-interactive region including the same semiconductive polymer material as a substantially continuous layer over the contact electrode region.

2. The structure of claim 1 in which the structure has a patterned surface at which each of the first channel region and the first light-interactive region is exposed.

3. A method comprising:
producing a layered structure that includes:
a set of semiconductive regions including:
one or more channel regions; and
one or more light-interactive regions;
the act of producing the layered structure comprising:
producing a first one of the channel regions and a first one of the light-interactive regions from the same semiconductive polymer material as a substantially continuous layer and producing a contacting electrode in charge-flow contact with the first light-interactive region and electrically connected to the first channel region so that, when conductive, the first channel region provides an electrical connection between the contacting electrode and other circuitry.

4. The method of claim 3 in which the act of producing the first channel region, the first light-interactive region, and the contacting electrode comprises:
producing a patterned electrically conductive electrode layer that includes the contacting electrode region; and
producing the first channel region and the first light-interactive region with the first channel region and the first light-interactive region each having a respective facing surface part that meets an exposed surface of the contacting electrode region.

5. The method of claim 3 in which the act of producing the first channel region, the first light-interactive region, and the contacting electrode comprises one of:
photolithographically patterning a layer of semiconductive polymer material to produce the first channel region and the first light-interactive region; and
printing semiconductive polymer material to produce the first channel region and the first light-interactive region.

6. A light-interactive device comprising:
a layered structure that includes:
an array with two or more cell regions, one or more of the cell regions each including a respective set of semiconductive subregions; each cell region's set of semiconductive subregions including:
one or more respective channel subregions; and
one or more respective light-interactive subregions;
each of a set of one or more of the cell regions further including a respective cell electrode subregion that is in charge-flow contact with a first one of the cell region's light-interactive subregions; when conductive, the cell region's first channel subregion providing an electrical connection between the respective cell electrode subregion and other circuitry; the first channel subregion and the first light-interactive subregion including the same semiconductive polymer material as a substantially continuous layer.

7. The device of claim 6 in which the layered structure further includes data lines, the respective first channel subregion of each cell region in the set being electrically connected to a respective one of the data lines.

8. The device of claim 7 in which each cell region in the set further including:
a capacitive component that includes at least part of the respective cell electrode subregion; in operation, the capacitive component capacitively storing signal levels and, when electrically connected to other circuitry through the respective first channel subregion, the cell electrode subregion providing an electrical signal to the respective data line indicating stored signal level.

9. The device of claim 7 a first one of the data lines extends along a subset of the cell regions; the layered structure further including:
a region of opaque insulating material that covers the first data line and the first channel region of each cell region in the subset.

10. The device of claim 6 in which the layered structure further includes a set of one or more covering layers over the array, the covering layers including at least one patterned opaque layer that includes, for each cell region in the set, a respective layer part covering the cell region's first channel region.

11. The device of claim 10 in which the patterned opaque layer does not extend over the cell region's entire first light-interactive region.

12. The device of claim 10 in which the patterned opaque layer includes insulating material; the other circuitry including two or more data lines that are approximately parallel, each electrically connected to the first channel regions of a respective subset of the cell regions in the set, the patterned opaque layer including two or more strips, each strip covering a respective one of the data lines and covering the first channel regions of the cell regions in the data line's respective subset.

13. The device of claim 12 in which the patterned opaque layer includes light absorbent dielectric material.

14. The device of claim 6 in which the array is a photosensing array.

15. A method comprising:
producing a layered structure that includes:
a set of semiconductive regions including:
one or more channel regions; and
one or more light-interactive regions;
the act of producing the layered structure comprising:
producing a contacting electrode; and
over the contacting electrode, printing and forming a first one of the channel regions and a first one of the light-interactive regions as a same continuous layer of semiconductive polymer material; the contacting electrode being in charge-flow contact with the first light-interactive region and electrically connected to the first channel region so that, when conductive, the first channel region provides an electrical connection between the contacting electrode and other circuitry.

16. The method of claim 15 in which the act of producing the layered structure further comprises:
depositing an opaque layer that covers the first channel region but does not extend over the entire first light-interactive region.

17. The method of claim 16 in which the layered structure includes a conductive line that extends along a set of channel regions including the first channel region; the act of depositing the opaque layer comprising:
depositing a patterned layer of opaque insulating material that covers the conductive line and each channel region in the set.

18. A layered structure comprising:
a contacting electrode layer;
a layer of semiconductive polymer material over the contacting electrode layer;
the layer of semiconductive polymer material being continuous over the contacting electrode layer and including:
a channel region; and
a light-interactive region that is operative as a charge generation layer; the contacting electrode layer being in charge-flow contact with a first side of the light-interactive region;
when conductive, the channel region providing an electrical connection between the contacting electrode layer and other circuitry;
a charge transport layer over the layer of semiconductive polymer material; charge transport layer including a conductive polymer material or organic material; and
a top electrode layer over the charge transport layer;
the charge transport layer being operative to transport charge carriers from the light-interactive region toward the top electrode layer in response to an electric field between the contacting electrode layer and the top electrode layer.

19. The structure of claim 18 in which the channel region has first and second channel end electrodes, the contacting electrode layer including the first channel end electrode.

20. The structure of claim 18 in which the light-interactive region includes a charge generation subregion in which free charge carriers are generated in response to incident light.

21. The structure of claim 20 in which the light-interactive region and the contacting electrode layer are in charge-flow contact at a contact surface; in operation, charge carriers flowing through the contact surface when free charge carriers are generated in the charge generation subregion.

22. The structure of claim 21, further comprising:
a capacitive component that includes at least part of the contacting electrode layer; in operation, the capacitive component capacitively storing signal levels indicating quantities of free charge carriers generated in the charge generation subregion and, when electrically connected to other circuitry through the channel region, the contacting electrode region providing an electrical signal to the other circuitry indicating stored signal level.

23. The structure of claim 18 in which the semiconductive polymer material includes at least one of polymer material and blends of polymers.

24. The structure of claim 18 in which the semiconductive polymer material includes one or more of poly(3-hexylthiophene), poly(3,3'''dialkylquaterthiophene) (PQT-12), poly(2,5-bis(3-dodecylthiophen-2yl)thienothiophene) (PBTTT), and poly(9,9-dioctylfluorene-alt-benzothiadiazole) (F8BT).

25. The structure of claim 18 in which each of the channel region and the light-interactive region is under a respective set of one or more covering layers.

26. The structure of claim 25 in which the channel region's respective set of covering layers includes at least one opaque layer; the light-interactive region's respective set of covering layers not including any opaque layers.

27. The structure of claim 25 in which the light-interactive region's respective set of covering layers includes the charge transport layer.

28. A layered structure according to claim 18 in which the charge transport layer includes one or more of N,N'-diphenyl-N,N'bis(3-methylphenyl)-(1-1'-biphenyl)-4,4'-diamine and alkylated-4,-4'diphenoquinones.

* * * * *